(12) United States Patent
Fu et al.

(10) Patent No.: US 12,262,513 B2
(45) Date of Patent: Mar. 25, 2025

(54) ELECTRONIC DEVICE

(71) Applicant: Honor Device Co., Ltd., Shenzhen (CN)

(72) Inventors: Guochao Fu, Shenzhen (CN); Xiangyu Wei, Shenzhen (CN); Yuanru Yang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/016,530

(22) PCT Filed: Aug. 30, 2022

(86) PCT No.: PCT/CN2022/115946
§ 371 (c)(1),
(2) Date: Jan. 17, 2023

(87) PCT Pub. No.: WO2023/036020
PCT Pub. Date: Mar. 16, 2023

(65) Prior Publication Data
US 2024/0260235 A1    Aug. 1, 2024

(30) Foreign Application Priority Data

Sep. 10, 2021  (CN) .......................... 202111062755.0
Dec. 17, 2021  (CN) .......................... 202111552791.5

(51) Int. Cl.
*H05K 7/20*     (2006.01)
*G06F 1/20*     (2006.01)
(Continued)

(52) U.S. Cl.
CPC ........ *H05K 7/20454* (2013.01); *G06F 1/203* (2013.01); *H01L 25/18* (2013.01);
(Continued)

(58) Field of Classification Search
CPC ............. H01L 2924/14; H01L 23/3735; H01L 23/49822; H01L 2224/16145;
(Continued)

(56) References Cited

U.S. PATENT DOCUMENTS

2016/0120068 A1*  4/2016  Tien ........................ B32B 9/007
428/167
2018/0061734 A1   3/2018  Lee et al.
(Continued)

FOREIGN PATENT DOCUMENTS

CN     103254830 A    8/2013
CN     205071567 U    3/2016
(Continued)

*Primary Examiner* — Mandeep S Buttar
(74) *Attorney, Agent, or Firm* — Slater Matsil, LLP

(57) ABSTRACT

An electronic device includes a first surface component, a heating device, and a first heat transfer assembly, where the first surface component includes a first surface, and the first surface forms an outer surface of the electronic device; the heating device is located on a side of the first surface component facing away from the first surface; and the first heat transfer assembly is located between the heating device and the first surface component, heat is conducted from the heating device to the first surface component through the first heat transfer assembly, a heat insulation structure is arranged in the first heat transfer assembly, and an orthographic projection of the heat insulation structure on the first surface overlaps with an orthographic projection of the heating device on the first surface.

20 Claims, 27 Drawing Sheets

(51) Int. Cl.
*H01L 25/18* (2023.01)
*H10K 59/80* (2023.01)
*H10K 59/95* (2023.01)

(52) U.S. Cl.
CPC ......... *H05K 7/20963* (2013.01); *H10K 59/87* (2023.02); *H10K 59/8794* (2023.02); *H10K 59/95* (2023.02)

(58) Field of Classification Search
CPC ............... H01L 23/5383; H01L 23/142; H01L 2023/4062; H01L 21/67103; H01L 21/76877; H05K 1/0203; H05K 1/0204; H05K 1/0206; H05K 1/0209; H05K 3/0061; H05K 7/2039; H05K 2201/066; H05K 7/209; H05K 1/021; H05K 7/20; H05K 1/0201; H05K 1/185; H05K 7/205; H05K 7/20509; H05K 7/20963; H05K 7/20854; H05K 2201/10371
USPC ............... 361/704, 707, 709, 720, 688, 718; 165/80.2; 257/712, 706, 23.101
See application file for complete search history.

(56) References Cited

U.S. PATENT DOCUMENTS

| | | | |
|---|---|---|---|
| 2018/0207901 A1* | 7/2018 | Tien | C09J 9/00 |
| 2020/0060043 A1 | 2/2020 | Lee et al. | |
| 2021/0135378 A1* | 5/2021 | Cho | H01Q 1/2283 |
| 2022/0061195 A1* | 2/2022 | Lee | H04M 1/0266 |
| 2022/0338341 A1* | 10/2022 | Hong | H01L 23/3677 |
| 2023/0065633 A1* | 3/2023 | Wilson | H05K 1/0207 |
| 2023/0079122 A1* | 3/2023 | Lee | G02F 1/13452 257/40 |
| 2023/0326829 A1* | 10/2023 | Zhao | H01L 23/3677 361/720 |

FOREIGN PATENT DOCUMENTS

| | | | |
|---|---|---|---|
| CN | 206402612 U | | 8/2017 |
| CN | 107768331 A | | 3/2018 |
| CN | 107969082 A | | 4/2018 |
| CN | 112804851 A | | 5/2021 |
| CN | 113290958 A | | 8/2021 |
| CN | 114068438 A | * | 2/2022 |

* cited by examiner

ELECTRONIC DEVICE

CROSS-REFERENCE TO RELATED APPLICATIONS

This application is a national stage of International Application No. PCT/CN2022/115946, filed on Aug. 30, 2022, which claims priority to Chinese Patent Application No. 202111062755.0, filed on Sep. 10, 2021, and Chinese Patent Application No. 202111552791.5, filed on Dec. 17, 2021. The disclosures of the aforementioned applications are hereby incorporated by reference in their entireties.

TECHNICAL FIELD

This application relates to the technical field of electronic products, and in particular, to an electronic device.

BACKGROUND

At present, as electronic devices such as mobile phones, notebook computers, and tablet personal computers have increasingly more functions and increasingly higher power consumption, heat generation amounts thereof become higher and higher. An excessively high heat generation amount not only affects heat experience of a user, but also easily causes a device to be burnt due to an excessively high internal temperature. Therefore, for an electronic device, how to improve heat dissipation efficiency and enhance the heat experience of the user is an important research direction for various manufacturers.

SUMMARY

Embodiments of this application provide an electronic device, to resolve problems of how to improve heat dissipation efficiency of the electronic device and how to improve heat experience for the electronic device.

To achieve the foregoing purpose, this application provides an electronic device. The electronic device includes a first surface component, a heating device, and a first heat transfer assembly.

The first surface component includes a first surface, and the first surface forms an outer surface of the electronic device.

The heating device is located on a side of the first surface component facing away from the first surface.

The first heat transfer assembly is located between the heating device and the first surface component, and heat is conducted from the heating device to the first surface component through the first heat transfer assembly. A heat insulation structure is arranged in the first heat transfer assembly, where the heat insulation structure can insulate heat. An orthographic projection of the heat insulation structure on the first surface overlaps with an orthographic projection of the heating device on the first surface.

In this way, by arranging the heat insulation structure, a speed at which heat of the heating device is transferred to the first surface component along a shortest branch path perpendicular to the first surface can be decreased. Therefore, on one hand, more of the heat produced by the heating device is transferred along another heat transfer path of the heating device, to accelerate a speed at which heat is transferred to another outer surface of the electronic device. In this way, a purpose of adjusting heat transfer speeds of a plurality of heat transfer paths can be achieved, which can reduce differences between the heat transfer speeds of the plurality of heat transfer paths, and enable the heat of the heating device to be uniformly transferred to a plurality of outer surfaces of the electronic device, thereby improving heat dissipation efficiency, avoiding heat concentration, and improving heat experience of a user. On the other hand, more of the heat produced by the heating device is transferred along another branch path around the shortest branch path perpendicular to the first surface, to accelerate a speed at which heat is transferred to another region around a region on the first surface and right opposite to the heating device. In this way, uniformity of heat that is transferred to various regions on the first surface is improved, thereby further improving the heat dissipation efficiency, avoiding heat concentration, and improving the heat experience of the user.

In some possible implementations, the first heat transfer assembly includes a first heat conducting member. The first heat conducting member includes a first stack structure. The first stack structure is formed by first heat conducting material layers and first adhesive layers that are alternately arranged in sequence and the heat insulation structure is arranged in the first adhesive layer. In this way, heat can be better spread on a plane where the first heat conducting material layer is located, to turn a point heat source into a surface heat source, thereby improving uniformity of heat that is transferred to different regions of the first surface. In addition, the heat insulation structure is arranged in the first adhesive layer, and there are a plurality of first adhesive layers. The heat insulation structure may be arranged in one of the first adhesive layers, or the heat insulation structures may respectively be arranged in the plurality of first adhesive layers, to meet insulation requirements of different scenarios.

In some possible implementations, a material of the first heat conducting material layer includes at least one of graphite, graphene, copper, or copper alloy. Heat conducting performance of these materials is relatively good, allowing heat to be spread quickly and uniformly.

In some possible implementations, there are a plurality of first adhesive layers and a plurality of heat insulation structures, and the plurality of heat insulation structures are respectively arranged in the plurality of first adhesive layers. In this way, a large quantity of heat insulation structures are arranged, which can be applied to a scenario with a relatively high heat insulating requirement.

In some possible implementations, one end portion of the first stack structure in a direction in which the first heat conducting material layers and the first adhesive layers are stacked is formed by the first adhesive layer. In this way, the first heat conducting member may be adhered to a structure such as a middle frame or a display module through the first adhesive layer without having to separately arrange a fixing structure, thereby saving costs.

In some possible implementations, the first adhesive layer forming the end portion of the first stack structure includes a third surface, and the third surface forms an outer surface of the first stack structure. The first stack structure further includes a fourth surface, and the fourth surface and the third surface face away from each other. The first heat conducting member further includes a first protective layer, and the first protective layer is arranged on the fourth surface of the first stack structure. The first protective layer is configured to protect the first stack structure, to prevent the first heat conducting material layer inside the first heat conducting member from being broken during transportation or assembly due to an external acting force.

In some possible implementations, the first surface component is a front cover plate.

In some possible implementations, the first heat transfer assembly further includes a middle frame. The middle frame is located between the first heat conducting member and the heating device. The middle frame and the first surface component are stacked and the heat insulation structure is arranged in the middle frame. The middle frame is relatively thick and relatively good in structural strength, thereby providing a better condition for arranging the heat insulation structure and preventing the middle frame from being deformed or broken during formation of the heat insulation structure through processing.

In some possible implementations, the electronic device further includes a display module, and the display module is located between the first heat conducting member and the first surface component. The display module includes a display panel and a support structure. The first heat transfer assembly further includes the support structure, and the heat insulation structure is arranged in the support structure. In this way, the heat insulation structure does not affect the display of the display panel.

In some possible implementations, the support structure includes a support layer, a first buffer layer, a flat layer, and a protective layer. The heat insulation structure is arranged in at least one of the support layer, the first buffer layer, the flat layer, or the protective layer.

In some possible implementations, the first surface component is a back cover.

In some possible implementations, the electronic device further includes a circuit board and a circuit board bracket. Both the circuit board and the circuit board bracket are located between the heating device and the first heat conducting member. The heating device is arranged on the circuit board, and the circuit board bracket is arranged on a side of the circuit board away from the heating device. The first heat transfer assembly further includes the circuit board bracket, and the heat insulation structure is arranged in the circuit board bracket. In this way, the heat insulation structure does not interfere with a circuit in the electronic device. In addition, since structural strength of the circuit board bracket is relatively high, it can be avoided that the circuit board bracket is deformed or broken during arrangement of the heat insulation structure.

In some possible implementations, the first heat transfer assembly further includes a second buffer layer. The second buffer layer is arranged between the first heat conducting member and the first surface component, and the heat insulation structure is arranged in the second buffer layer. The second buffer layer is usually made of a soft and elastic material such as foam and therefore is relatively low in hardness, which is convenient for the arrangement of the heat insulation structure.

In some possible implementations, the heat insulation structure includes at least one of a heat insulation air hole, heat insulation aerogel, asbestos, rock wool, ceramic fiber paper, fiberglass wool, silicate, or a vacuum plate.

In some possible implementations, in the first heat transfer assembly, the component where the heat insulation structure is located includes a first portion. An orthographic projection of the first portion on the first surface is a first projection, and an orthographic projection of the heating device on the first surface is a second projection, where the second projection is located in the first projection, a distance between an edge of the second projection and an edge of the first projection is less than or equal to ½ of a maximum width of the second projection, and the heat insulation structure is arranged in the first portion. In this way, the heat insulation structure is centrally arranged in a region that is on the component where the heat insulation structure is located and that is right opposite to the heating device, thereby providing a relatively good heat insulation effect.

In some possible implementations, the component where the heat insulation structure is located further includes a second portion. The second portion is a portion other than the first portion on the component where the heat insulation structure is located, and no heat insulation structure is arranged in the second portion. In this way, a heat conduction capability of the second portion is relatively good, and a relatively large amount of heat of the heating device is conducted to another region around a region on the first surface and right opposite to the heating device, thereby enabling a relatively good heat dissipation performance.

In some possible implementations, the electronic device further includes a second surface component, and the second surface component includes a second surface. The second surface forms another outer surface of the electronic device. The heating device is further located on a side of the second surface component facing away from the second surface, and heat is conducted from the heating device to the second surface component. In this way, after the heat insulation structure is arranged in the first heat conducting member, a speed at which heat is transferred from the heating device to the second surface can be improved to increase a heat amount of the second surface, so that heat of the first surface and the second surface can be more uniform, thereby improving heat dissipation efficiency.

In some possible implementations, the electronic device further includes a second heat transfer assembly. The second heat transfer assembly is located between the heating device and the second surface component, and heat is conducted from the heating device to the second surface component through the second heat transfer assembly. In this way, conduction of heat can be implemented without enabling the heating device to be in direct contact with the second surface component, and therefore, a relative position between the heating device and the second surface component can be set more flexibly.

In some possible implementations, the second heat transfer assembly includes a second heat conducting member. The second heat conducting member includes a second stack structure, and the second stack structure is formed by second heat conducting material layers and second adhesive layers that are alternately arranged in sequence. In this way, heat can be better spread on a plane where the second heat conducting material layer is located, to turn a point heat source into a surface heat source, thereby improving uniformity of heat that is transferred to different regions of the second surface.

In some possible implementations, a material of the second heat conducting material layer includes at least one of graphite and graphene. The graphite and graphene are relatively large in heat conduction coefficients and relatively high in heat conduction efficiency, which can accelerate a speed at which the heat of the heating device is transferred to the second surface component, thereby further reducing a temperature difference between the first surface and the second surface and improving the heat dissipation efficiency.

In some possible implementations, the first surface includes a first region, and the orthographic projection of the heating device on the first surface is the second projection, where the first region overlaps with the second projection. The second surface includes a second region, and an orthographic projection of the heating device on the second surface is a third projection, where the second region overlaps with the third projection. A speed at which heat is transferred from the heating device to the first region is equal or approximately equal to a speed at which heat is transferred from the heating device to the second region. In this way, the temperature difference between the first surface and the second surface is approximately 0, that is, uniformity of temperatures of the first surface and the second surface is relatively good, and the heat dissipation performance is more desirable.

In some possible implementations, the heating device includes at least one of an SOC, a CPU, a CHG management chip, a power management chip, a RAM, or a ROM.

BRIEF DESCRIPTION OF THE DRAWINGS

FIG. 11 is a front view of a middle frame in the electronic device shown in FIG. 10a;

FIG. 12 is a front view of a first surface component in the electronic device shown in FIG. 10a;

DETAILED DESCRIPTION OF ILLUSTRATIVE EMBODIMENTS

Figure 1:
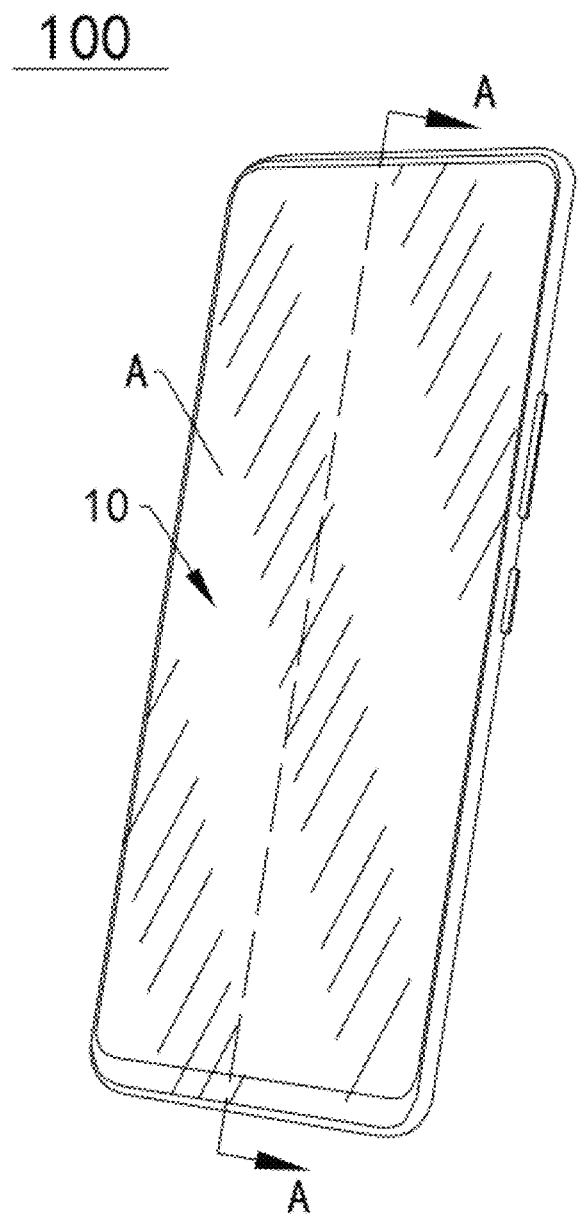
FIG. 1 is a three-dimensional view of a front side of an electronic device according to some embodiments of this application.

In the embodiments of this application, the terms "first", "second", "third" and "fourth" are used merely for the purpose of description, and shall not be construed as indicating or implying relative importance or implying a quantity of indicated technical features. Therefore, features defined by "first", "second", "third" and "fourth" may explicitly or implicitly include one or more such features.

In the embodiments of this application, terms "include", "comprise", and any variants thereof are intended to cover a non-exclusive inclusion. Therefore, in the context of a process, method, object, or apparatus that includes a series of elements, the process, method, object, or apparatus not only includes such elements, but also includes other elements not specified expressly, or may include inherent elements of the process, method, object, or apparatus. Unless otherwise specified, elements defined by the sentence "including one" does not exclude that there are still other same elements in the processes, methods, objects, or apparatuses.

In description of this application, "and/or" used herein describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

Heat of an electronic device is generated by an internal electronic device. To decrease a temperature of the electronic device, the heat of the internal electronic device may be led to the outside of the device in a manner of force convection (such as air cooling, water cooling, or oil cooling). However, due to limited spaces of portable electronic devices such as mobile phones and tablet personal computers, dedicated cooling devices cannot be mounted therein. Therefore, currently, for these electronic devices, heat generated by internal electronic devices is conducted to outer surfaces of the electronic devices still in a manner of enabling various components to be in contact with each other to perform heat conduction. Then, heat of the outer surfaces is further exchanged with surrounding air, to achieve a purpose of heat dissipation and cooling.

In the foregoing cooling manner, the larger a region of an outer surface to which heat is conducted is, the larger an area for performing heat exchange with the air is, and the better a heat dissipation effect is. Therefore, for an internal electronic device, especially for an electronic device with a large heat generation amount such as a system on chip (system on chip, SOC), a charge management chip, a power management chip, a random access memory (random access memory, RAM), or a read only memory image (read only memory image, ROM), a plurality of heat transfer paths often need to be arranged to transfer the heat to a plurality of outer surfaces of the electronic device. For example, in an internal electronic device of a mobile phone, two heat transfer paths respectively extending to a screen side and a back cover side are often arranged, to transfer heat to a front surface (that is, a top surface) and a rear surface (that is, a bottom surface) of the mobile phone, thereby enlarging an area for performing heat exchange with external air and improving heat dissipation efficiency.

In a case that the heat inside the electronic device is transferred to the plurality of outer surfaces through the plurality of heat transfer paths, the smaller temperature differences between the plurality of outer surfaces are, the more uniform the heat transferred to the plurality of outer surfaces is, and the better the heat dissipation effect is. However, since lengths of the heat transfer paths of the electronic devices inside the electronic devices are often not the same, and heat conduction coefficients of components on the heat transfer paths are usually different, heat resistance is different. As a result, the heat is mainly transferred to a certain outer surface of the electronic device along a certain heat transfer path, or is mainly transferred to several outer surfaces of the electronic device along several heat transfer paths. For example, heat inside a mobile phone is mainly transferred from a screen side of the mobile phone to a top surface, or is mainly transferred from a back cover side of the mobile phone to a bottom surface. Consequently, temperatures transferred to the outer surfaces of the electronic device are not uniform, and the heat dissipation efficiency is low. Furthermore, there may be a case in which a certain surface or a plurality of surfaces are too hot to touch, causing heat experience of a user to be poor.

To resolve the foregoing problems, in this application, a heat conduction coefficient of a certain component on a heat transfer path with relatively high efficiency can be decreased, and/or a heat conduction coefficient of a certain component on a heat transfer path with relatively low efficiency can be increased. Specifically, a heat insulation structure may be arranged on the heat transfer path with relatively high efficiency, to decrease a heat transfer speed on the heat transfer path, and/or a structure with high heat conductivity may be arranged on the heat transfer path with relatively low efficiency, to increase a heat transfer speed on the heat transfer path. Therefore, more heat is conducted to the outer surfaces of the electronic device along the heat transfer path with relatively low efficiency, so that the heat is uniformly or approximately uniformly transferred to the plurality of outer surfaces of the electronic device, thereby improving the heat dissipation efficiency of the electronic device.

In this way, there is no need to change sizes of the electronic device and internal components and parts thereof. Therefore, in addition to achieving a thin and miniaturized volume design of the electronic device, structural strength of the internal components can also be guaranteed simultaneously.

Based on the foregoing improvement manner, the embodiments of this application are described below in detail with reference to the accompanying drawings. Before the embodiments of this application are described, application scenarios of this application are first described.

This application provides an electronic device. The electronic device may be a portable electronic device or another suitable electronic device. For example, the electronic device may be a mobile phone, a smart screen (TV), a tablet personal computer (tablet personal computer), a notebook computer, a laptop computer (laptop computer), a speaker, a display, a medical instrument, a personal digital assistant (personal digital assistant, PDA), a camera, a personal computer, an in-vehicle device, a wearable device, or the like. The wearable device includes but is not limited to a bracelet, a watch, a pair of augmented reality (augmented reality, AR) glasses, an AR helmet, a pair of virtual reality (virtual reality, VR) glasses, a VR helmet, or the like.

Figure 2:
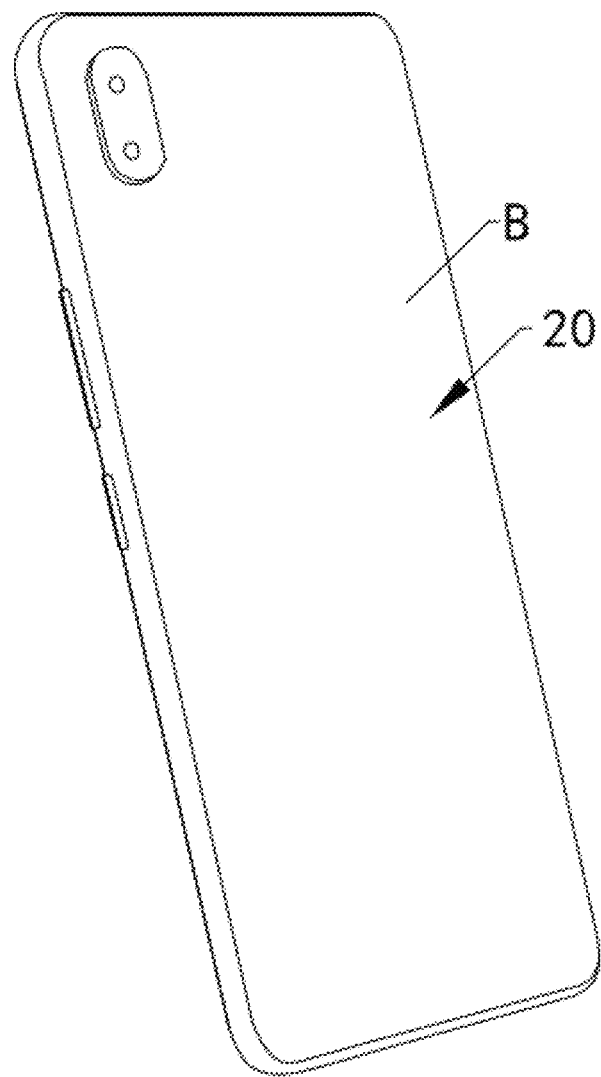
FIG. 2 is a three-dimensional view of a rear side of the electronic device shown in FIG. 1.
Figure 3:
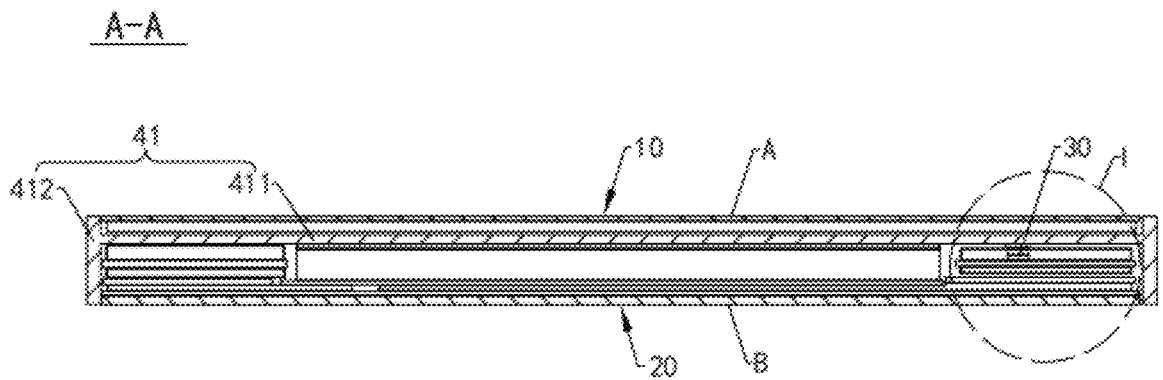
FIG. 3 is a schematic cross-sectional structural diagram of the electronic device shown in FIG. 1 taken along line A-A.

Refer to FIG. 1 to FIG. 3. FIG. 1 is a three-dimensional view of a front side of an electronic device 100 according to some embodiments of this application; FIG. 2 is a three-dimensional view of a rear side of the electronic device 100 shown in FIG. 1; and FIG. 3 is a schematic cross-sectional structural diagram of the electronic device 100 shown in FIG. 1 taken along line A-A. It should be noted that "taken along line A-A" means taking along a plane where the line A-A and arrows at two ends of the line A-A are located. Descriptions of similar accompanying drawings in the following context should be understood in the same way, and details are not described again in the following context. In this embodiment, the electronic device 100 is a mobile phone. The electronic device 100 includes a first surface component 10 and a second surface component 20.

The first surface component 10 forms an outer surface of the electronic device 100, and the second surface component 20 forms another outer surface of the electronic device 100.

Specifically, the first surface component 10 includes a first surface A, and the first surface A forms an outer surface of the electronic device 100. The second surface component 20 includes a second surface B, and the second surface B forms another outer surface of the electronic device 100.

In some embodiments, referring to FIG. 1 to FIG. 3, the first surface A and the second surface B are two outer surfaces of the electronic device 100 that face away from each other. In some other embodiments, there may be another relative position relationship such as an adjacent relationship, an intersecting relationship, a perpendicular relationship, or the like between the first surface A and the second surface B. This is not specifically limited in the embodiments of this application.

In some embodiments, referring to FIG. 1 to FIG. 3, the first surface component 10 is a front cover plate, and the second surface component 20 is a back cover. In this case, the first surface A is a top surface, and the second surface is a bottom surface. In some other embodiments, the first surface component 10 may alternatively be the back cover, and the second surface component 20 may be the front cover plate. In a case that the electronic device 100 is in other structural forms other than a mobile phone, the first surface component 10 and the second surface component 20 may alternatively be other components. This is not specifically limited in this application. For ease of description, the following embodiments are all described on the basis that the first surface component 10 is the front cover plate and the second surface component 20 is the back cover.

Referring to FIG. 3, the electronic device 100 further includes a heating device 30. The heating device 30 is an electronic device in the electronic device 100 and generates a relatively large amount of heat. Specifically, the heating device 30 includes but is not limited to a system on chip (system on chip, SOC), a central processing unit (central processing unit, CPU), a charge (charge, CHG) management chip, a power management chip, a RAM, and a ROM.

Figure 4:
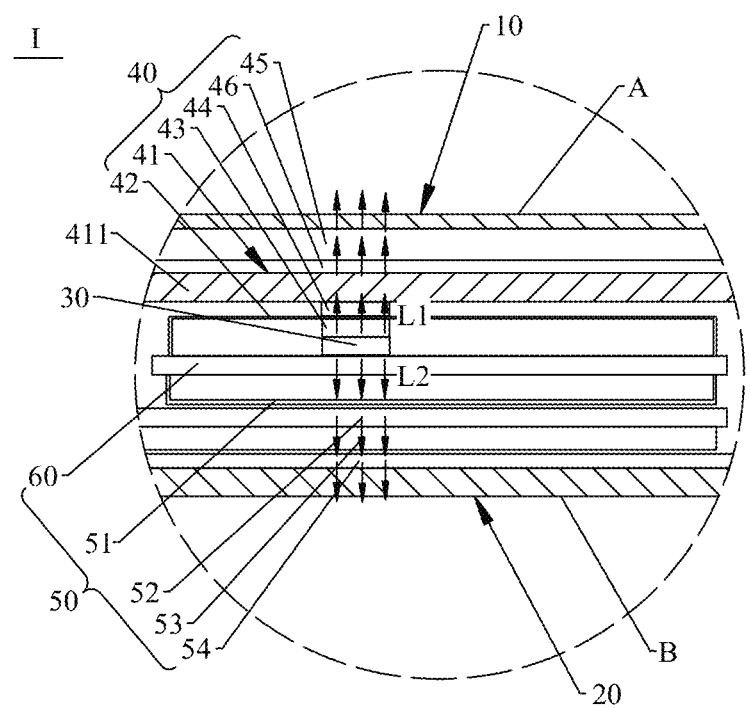
FIG. 4 is a partial enlarged view of a region I in FIG. 3.

In some embodiments, FIG. 4 is a partial enlarged view of a region I in FIG. 3. The electronic device 100 further includes a circuit board 60. The heating device 30 is arranged on the circuit board 60. The heating device 30 may be fixed inside the electronic device 100 through the circuit board 60, and may also be electrically connected to another electronic device through the circuit board 60, to facilitate arrangement of a circuit and ensure stability of the structure.

The circuit board 60 may be a printed circuit board (printed circuit board, PCB), or may be a flexible printed circuit board (flexible printed circuit board, FPC), or may be a rigid-flex circuit board. The circuit board 60 may be a main board, or may be a secondary board, or may be another circuit board, and this is not specifically limited in this application.

In some embodiments, referring to FIG. 4, the circuit board 60 is located on a side of the heating device 30 away from the first surface component 10, and is located between the heating device 30 and the second surface component 20. In some other embodiments, the circuit board 60 may alternatively be located between the heating device 30 and the first surface component 10, and is located on a side of the heating device 30 away from the second surface component 20. For ease of description, the following embodiments are all described on the basis that the circuit board 60 is located on the side of the heating device 30 away from the first surface component 10.

In the electronic device 100, the heating device 30 includes at least two heat transfer paths. The two heat transfer paths are respectively the following heat transfer path one I1 and heat transfer path two I2.

The heat transfer path one I1: Heat generated during operation of the heating device 30 is transferred to the first surface component 10, and then heat exchange occurs between the first surface A of the first surface component 10 and external air.

Still referring to FIG. 4, the electronic device 100 further includes a first heat transfer assembly 40. The first heat transfer assembly 40 is located in the heat transfer path one I1. Specifically, the first heat transfer assembly 40 is located between the heating device 30 and the first surface component 10. Heat is conducted from the heating device 30 to the first surface component 10 through the first heat transfer assembly 40, so that the heat generated during operation of the heating device 30 is transferred to the first surface component 10 through the first heat transfer assembly 40.

In some embodiments, referring to FIG. 4, the first heat transfer assembly 40 includes a middle frame 41. The middle frame 41 and the first surface component 10 are stacked. It should be noted that the stacked arrangement described in this embodiment and the following embodiments may be interpreted as contact stacked arrangement, that is, two stacked components are in contact with each other, or may be interpreted as non-contact stacked arrangement, that is, two stacked components are not in contact with each other. Optionally, that the middle frame 41 and the first surface component 10 are stacked refers to non-contact stacked arrangement. The middle frame 41, which is used as a "support skeleton" of the electronic device 100, can support and fix components such as the circuit board 60, the first surface component 10, and the second surface component 20. To ensure support strength of the middle frame 41, the middle frame 41 may be made of a hard metal material such as stainless steel, aluminum alloy, or titanium alloy. Structural strength of the hard metal material is relatively high, which can ensure the structural strength. In addition, a heat conduction coefficient of a metal material is usually relatively large, which means a better heat dissipation capability, thereby enabling the heat of the heating device 30 to be conducted to the first surface component 10 quickly.

Specifically, referring to FIG. 3 and FIG. 4 together, the middle frame 41 includes a middle plate 411 and a frame 412. The middle plate 411 is located between the first surface component 10 and the second surface component 20. In addition, the middle plate, the first surface component 10, and the second surface component 20 are stacked. The frame 412 is arranged around the middle plate 411. In some embodiments, the frame 412 is arranged around a circumference of the middle plate 411. The frame 412 and the middle plate 411 may be integrally formed, or the frame may be fixed to an edge of the middle plate 411 by using an adhesive. Both the first surface component 10 and the second surface component 20 are fixed to the frame 412. Specifically, the first surface component 10 and the second surface component 20 may be fixed to the frame 412 by using an adhesive.

Based on the foregoing embodiment, the middle frame 41 transfers the heat of the heating device 30 to the first surface component 10 through the middle plate 411. Specifically, the heat of the heating device 30 is transferred to the middle plate 411, and the heat transferred to the middle plate 411 is further transferred to the first surface component 10.

In some embodiments, still referring to FIG. 4, the first heat transfer assembly 40 further includes a first shielding cover 42. The first shielding cover 42 is arranged on the circuit board 60, and is arranged outside the heating device 30 in a covering manner. The first shielding cover 42 is configured to prevent electronic devices (including the heating device 30) on the circuit board 60 from being interfered by an external electromagnetic wave. A material of the first shielding cover 42 is usually selected to be a conductive metal material such as copper or copper alloy. These conductive metal materials are better in conductivity performance and shielding performance. In addition, these conductive metal materials have relatively large heat conduction coefficients and better heat conduction capabilities, which can ensure heat transfer efficiency of the heat transfer path one 1.

In some embodiments, still referring to FIG. 4, the first heat transfer assembly 40 further includes a first heat conducting medium 43 and a second heat conducting medium 44. The first heat conducting medium 43 is arranged between the heating device 30 and the first shielding cover 42 and is configured to transfer the heat of the heating device 30 to the first shielding cover 42. The second heat conducting medium 44 is arranged between the first shielding cover 42 and the middle frame 41 and further transfers heat of the first shielding cover 42 to the middle frame 41.

The first heat conducting medium 43 and the second heat conducting medium 44 include but are not limited to heat conducting gel, heat conducting silicone grease, liquid metal, graphite, graphene, copper, copper alloy, or the like. This is not specifically limited in this application.

In some embodiments, still referring to FIG. 4, the first heat transfer assembly 40 further includes a display module 45. The display module 45 is arranged between the first surface component 10 and the middle frame 41. Heat of the middle frame 41 is transferred to the first surface component 10 through the display module 45.

The display module 45 is configured to display a video and an image. The video and image displayed by the display module 45 can be seen by a user from a side that the first surface A faces towards. To achieve this purpose, on one hand, a light-emitting surface of the display module 45 faces towards the first surface component 10. On the other hand, the first surface component 10 is a light-transmitting structure. Specifically, the first surface component 10 may be a light-transmitting glass component or a light-transmitting plastic component. In this way, it can be avoided that image light displayed by the display module 45 is shielded by the first surface component 10.

Figure 5:
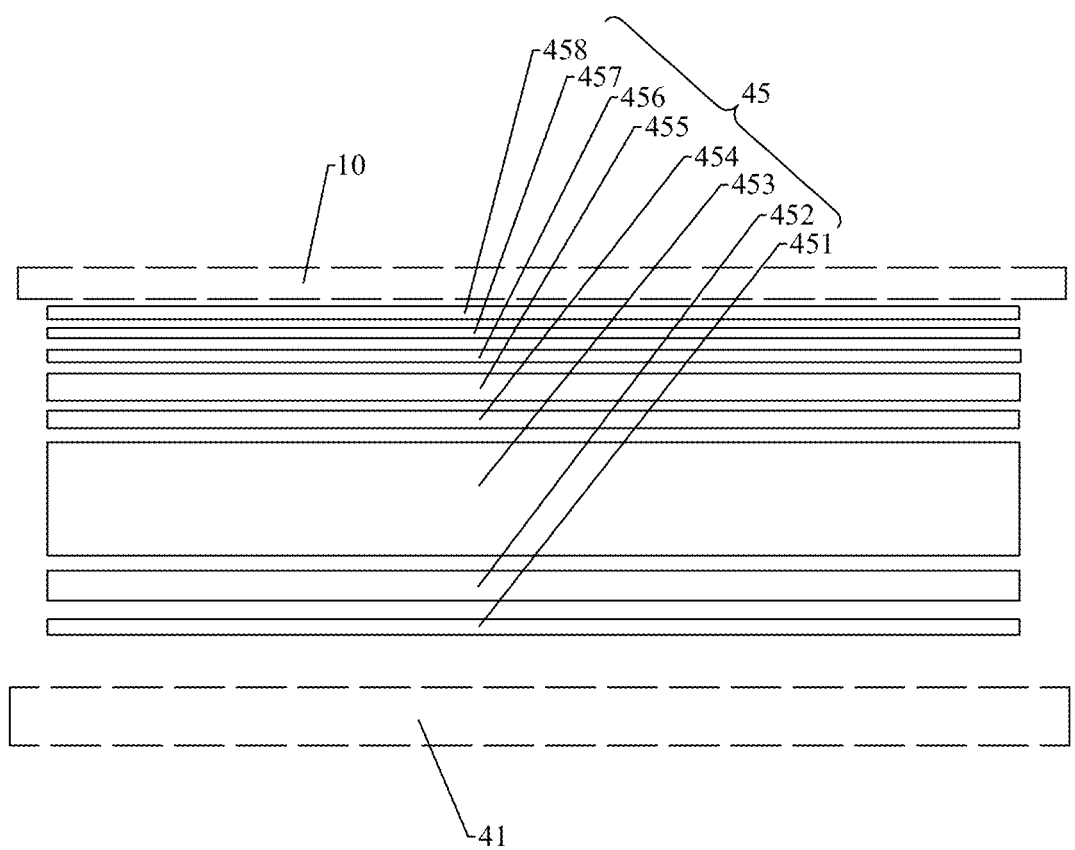
FIG. 5 is a schematic structural diagram of a display module in the electronic device shown in FIG. 4.

FIG. 5 is a schematic structural diagram of the display module 45 in the electronic device 100 shown in FIG. 4. The display module 45 includes a shielding layer 451, a support layer 452, a first buffer layer 453, a flat layer 454, a protective layer 455, a display panel (panel) 456, a polarizer 457, and a transparent adhesive layer 458 that are sequentially stacked from an end close to the middle frame 41 to an end close to the first surface component 10. The stacked arrangement indicates contact stacked arrangement. In addition, the support layer 452, the first buffer layer 453, the flat layer 454, and the protective layer 455 form a support structure of the display panel 456. Structures and functions of the components of the display module 45 are respectively described below.

The display panel 456 is a core device in the display module 45 for displaying a video and an image. The display panel 456 may be a flexible display panel or a rigid display panel. For example, the display panel 456 may be an organic light-emitting diode (organic light-emitting diode, OLED) display panel, an active-matrix organic light-emitting diode (active-matrix organic light-emitting diode, AMOLED) display panel, a mini light-emitting diode (mini organic light-emitting diode) display panel, a micro light-emitting diode (micro organic light-emitting diode) display panel, a micro organic light-emitting diode (micro organic light-emitting diode) display panel, a quantum dot light-emitting diode (quantum dot light emitting diodes, QLED) display panel, or a liquid crystal display (liquid crystal display, LCD) panel. In the embodiment shown in FIG. 5, the display panel 456 is a self-luminous display panel. The self-luminous display panel does not need a back light module to provide back light, which helps a thickness of the electronic device 100 be thin. Specifically, the display panel 456 is an OLED display panel. The OLED display panel is a common self-luminous display panel, which is easy to be implemented and relatively thin in thickness, thereby further helping the thickness of the electronic device 100 be thin.

The protective layer 455 is also referred to as a BP (back plate file) layer and is configured to support and protect the display panel 456. Before the display module 45 is formed through assembly, the protective layer 455 and the display panel 456 have been fixed together, thereby improving the structural strength of the display panel 456 and preventing the display panel 456 from being bent and damaged during formation of the display module 45 through assembly.

The polarizer 457 is arranged on a light-emitting surface of the display panel 456 and is configured to remove external reflected light to ensure a display effect of the display module 45.

The transparent adhesive layer 458 is configured to adhere the polarizer 457 to the first surface component 10. In addition, the transparent adhesive layer 458 can transmit image light emitted by the display panel 456, thereby preventing the image light from being shielded. In some embodiments, the transparent adhesive layer 458 is an optically clear adhesive (optically clear adhesive, OCA).

The flat layer 454 is arranged on the protective layer 455 for improving surface flatness of the protective layer 455. Optionally, a material of the flat layer 454 is a grid adhesive.

The first buffer layer 453 is configured to protect the display panel 456 through buffering and absorb point impact, to avoid generation of impressions and fragmented bright spots. Optionally, the material of the first buffer layer 453 includes but is not limited to foam.

The support layer 452 is further configured to protect the display panel 456 through buffering, to avoid generation of the impressions and fragmented bright spots. Optionally, the support layer 452 may be a polyimide film (polyimide film, PI).

The shielding layer 451 provides electromagnetic shielding and antistatic functions, to prevent an electronic device on a side of the middle frame 41 away from the first surface component 10 from generating electromagnetic interference and electrostatic interference to the display panel 456. A material of the shielding layer 451 may be copper or copper alloy. Based on this, the shielding layer 451 may further provide heat dissipation and protection functions.

A structure of the display module 45 is a common structure of the display module, and is relatively good in anti-interference performance and structural strength and relatively thin in thickness, which helps achieve a thin thickness of the electronic device. Based on this, a path along which heat is transferred from the middle frame 41 to the first surface component 10 is specifically as follows: the middle frame 41→the shielding layer 451→the support layer 452→the first buffer layer 453→the flat layer 454→the protective layer 455→the display panel 456→the polarizer 457→the transparent adhesive layer 458→the first surface component 10. Heat is conducted between two adjacent structures mainly by enabling the two structures to be in contact with each other. Certainly, there may also be a small amount of heat to be transferred through heat radiation.

It should be noted that the structure of the display module 45 may be in other forms, for example, at least one of the shielding layer 451, the support layer 452, the first buffer layer 453, the flat layer 454, the protective layer 455, the polarizer 457, or the transparent adhesive layer 458 is not included, and/or another structural layer is added. This is not specifically limited herein.

In some embodiments, referring to FIG. 4 again, the first heat transfer assembly 40 further includes a first heat conducting member 46. The first heat conducting member 46 is arranged between the middle frame 41 and the display module 45, and is configured to transfer the heat of the middle frame 41 to the display module 45.

A material of the first heat conducting member 46 includes but is not limited to heat conducting gel, heat conducting silicone grease, liquid metal, graphite, graphene, copper, copper alloy, or the like. This is not specifically limited in this application.

Figure 6:
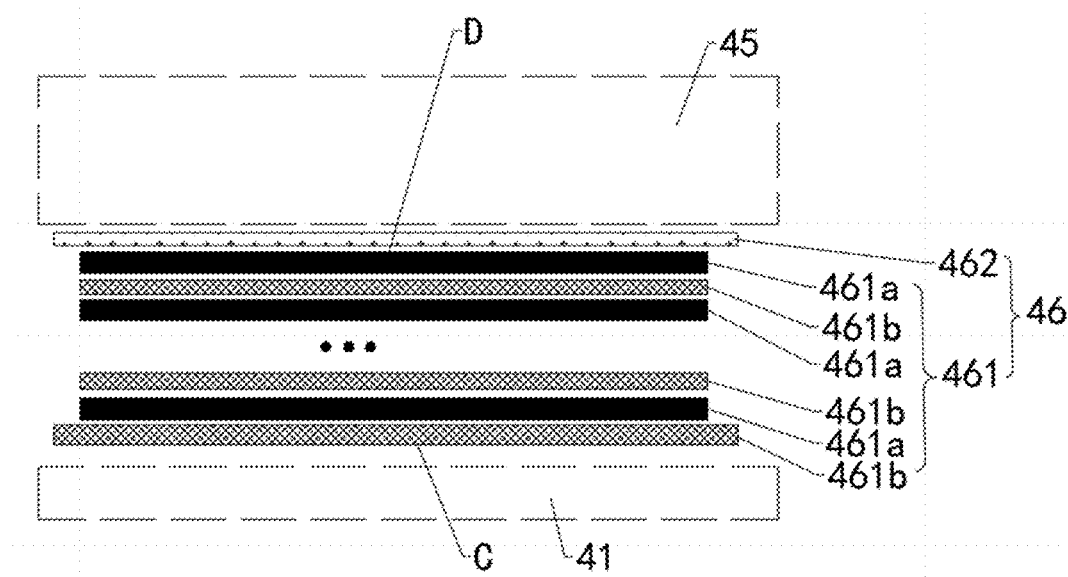
FIG. 6 is a schematic structural diagram of a third heat conducting medium in the electronic device shown in FIG. 4.

FIG. 6 is a schematic structural diagram of the first heat conducting member 46 in the electronic device 100 shown in FIG. 4. The first heat conducting member 46 includes a first stack structure 461, and the first stack structure 461 is formed by first heat conducting material layers 461*a* and first adhesive layers 461*b* that are alternately arranged in sequence.

A material of the first heat conducting material layer 461*a* includes but is not limited to at least one of graphite, graphene, copper, or copper alloy. A material of the first adhesive layer 461*b* includes but is not limited to at least one of a double-sided adhesive or a liquid adhesive.

The first adhesive layer 461*b* has heat conducting performance, but a heat conduction coefficient of the first adhesive layer 461*b* is less than a heat conduction coefficient of the first heat conducting material layer 461*a*. In this way, heat can be better spread on a plane where the first heat conducting material layer 461*a* is located, to turn a point heat source into a surface heat source, thereby improving uniformity of heat that is transferred to different regions of the first surface A.

With an increase in a quantity of the first heat conducting material layer 461*a* and the first adhesive layer 461*b*, the uniformity is more desirable. In addition, in a case that the first heat conducting material layer 461*a* is made of graphite or graphene with a relatively high heat conduction coefficient, a capability of the heat to be spread on the plane where the first heat conducting material layer 461*a* is located is better, and heat uniformity of the first heat conducting member 46 can be further improved.

Still referring to FIG. 6, an end portion of the first stack structure 461 in a direction in which the first heat conducting material layers 461*a* and the first adhesive layers 461*b* are stacked is formed by the first adhesive layer 461*b*. In this way, the first stack structure 461 may be adhered to the middle frame 41 through the first adhesive layer 461*b* that forms the end portion of the first stack structure 461.

Figure 7:
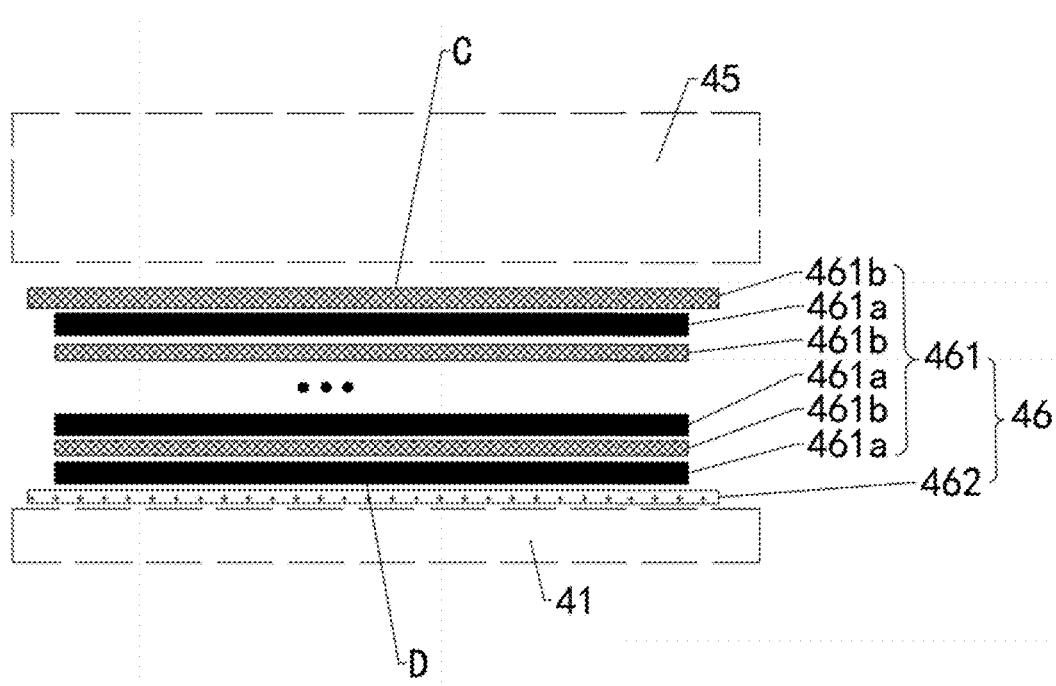
FIG. 7 is a schematic diagram of relative positions of a third heat conducting medium, a middle frame, and a display module in an electronic device according to still other embodiments of this application.

In some other embodiments, FIG. 7 is a schematic diagram of relative positions of a first heat conducting member 46, a middle frame 41, and a display module 45 in an electronic device 100 according to still other embodiments of this application. The first stack structure 461 is adhered to the display module 45 through the first adhesive layer 461*b* that forms the end portion of the first stack structure 461.

In some embodiments, referring to FIG. 6 or FIG. 7, the first adhesive layer 461*b* that forms the end portion of the first stack structure 461 includes a third surface C, and the third surface C forms an outer surface of the first stack structure 461. Based on this, the first stack structure 461 further includes a fourth surface D opposite to the third surface C. The first heat conducting member 46 further includes a first protective layer 462. A material of the first protective layer 462 includes but is not limited to polyethylene terephthalate (polyethylene terephthalate, PET) and polypropylene (polypropylene, PP). The first protective layer 462 is arranged on the fourth surface D of the first stack structure 461. The first protective layer 462 is configured to protect the first stack structure 461, to prevent the first heat conducting material layer 461*a* inside the first heat conducting member 46 from being broken during transportation or assembly due to an external acting force.

In some embodiments, referring to FIG. 6 or FIG. 7, both an area of the first protective layer 462 and an area of the first adhesive layer 461*b* where the third surface C is located are greater than an area of the first heat conducting material layer 461*a*, to respectively form an edge covering protective layer and an edge covering adhesive layer. In this way, the first heat conducting material layer 461*a* can be further protected, thereby lowering a broken risk of the first heat conducting material layer 461*a*.

According to the descriptions of the foregoing embodiments, the first heat transfer assembly 40 may include the middle frame 41, the first shielding cover 42, the first heat conducting medium 43, the second heat conducting medium 44, the display module 45, and the first heat conducting member 46. A path along which heat is transferred from the heating device 30 to the first surface component 10 through the first heat transfer assembly 40 is specifically as follows: the heating device 30→the first heat conducting medium 43→the first shielding cover 42→the second heat conducting medium 44→the middle frame 41→the first heat conducting member 46→the display module 45→the first surface component 10. Heat is conducted between two adjacent components mainly by enabling the two adjacent components to be in contact with each other. Certainly, there may also be a small amount of heat to be transferred through heat radiation. In some embodiments, the first heat transfer assembly 40 may not be arranged with one or more of the middle frame 41, the first shielding cover 42, the first heat conducting medium 43, the second heat conducting medium 44, the display module 45 and the first heat conducting member 46, and/or the first heat transfer assembly 40 may further include another layer. This is not specifically limited in this application.

The heat transfer path two I2: Still referring to FIG. 4, the heat generated during operation of the heating device 30 is transferred to the second surface component 20, and heat exchange occurs between the second surface B of the second surface component 20 and the external air.

In some embodiments, still referring to FIG. 4, the electronic device 100 further includes a second heat transfer assembly 50. The second heat transfer assembly 50 is located in the heat transfer path two I2. Specifically, the second heat transfer assembly 50 is located between the heating device 30 and the second surface component 20. Heat is conducted from the heating device 30 to the second surface component 20 through the second heat transfer assembly 50, so that the heat generated during operation of the heating device 30 is transferred to the second surface component 20 through the second heat transfer assembly 50.

In some other embodiments, the electronic device 100 may not be arranged with the second heat transfer assembly 50, so that the heating device 30 is in direct contact with the second surface component 20 for heat conduction. The following embodiments are all described on the basis that the electronic device 100 includes the second heat transfer assembly 50 and the heat of the heating device 30 is transferred to the second surface component 20 through the second heat transfer assembly 50. This cannot be considered as a special limitation to this application.

In some embodiments, still referring to FIG. 4, the second heat transfer assembly 50 includes the circuit board 60. The heat of the heating device 30 is transferred to the second surface component 20 through the circuit board 60. Specifically, the heat of the heating device 30 may be transferred to the circuit board 60, and the heat transferred to the circuit board 60 is further transferred to the second surface component 20.

In some embodiments, still referring to FIG. 4, the second heat transfer assembly 50 further includes a second shielding cover 51. The second shielding cover 51 is arranged on the circuit board 60, and is arranged outside a surface of the circuit board 60 facing away from the heating device 30 in a covering manner. The second shielding cover 51 is configured to prevent the electronic device on the surface of the circuit board 60 facing away from the heating device 30 from being interfered by an external electromagnetic wave. A material of the second shielding cover 51 is usually selected to be a conductive metal material such as copper and copper alloy. These conductive metal materials are better in conductivity performance and shielding performance. In addition, these conductive metal materials have relatively large heat conduction coefficients and better heat conduction capabilities, which can ensure heat transfer efficiency of the heat transfer path two L2.

In some embodiments, still referring to FIG. 4, the second heat transfer assembly 50 further includes a circuit board bracket 52. The circuit board bracket 52 is located between the circuit board 60 and the second surface component 20, and is located on a side of second shielding cover 51 away from the circuit board 60. The circuit board bracket 52 is configured to protect the circuit board 60, so that the circuit board 60 can still operate normally when being subject to impact, deformation, a high temperature, and the like. Heat transferred to the second shielding cover 51 may be transferred to the second surface component 20 through the circuit board bracket 52.

Figure 8:
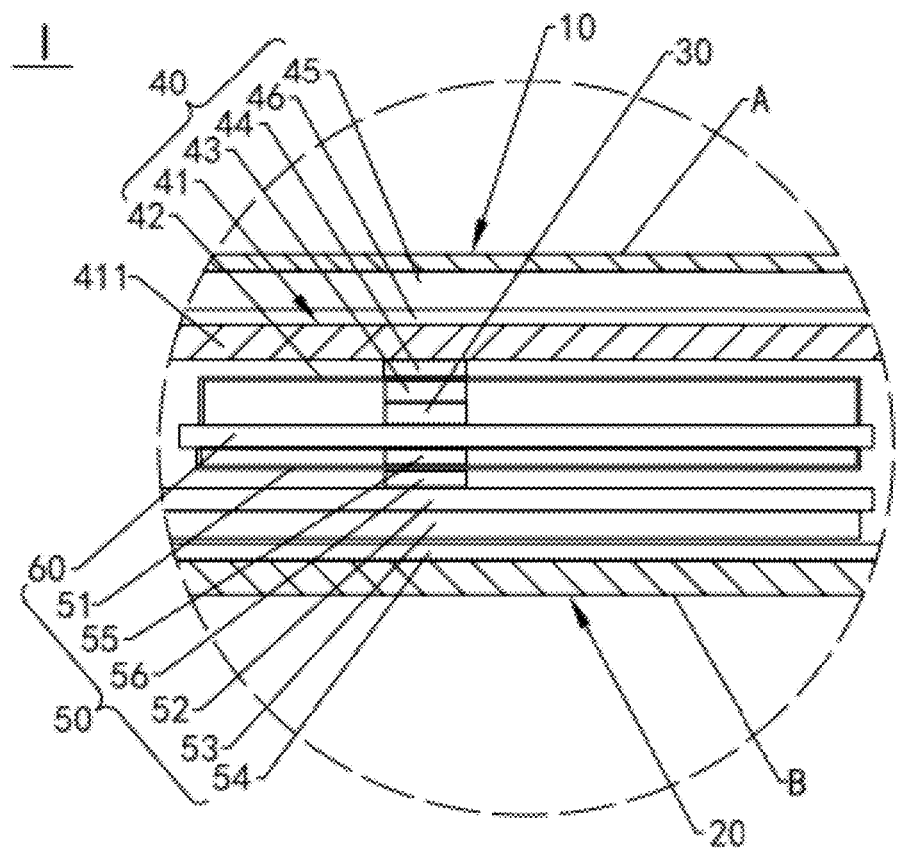
FIG. 8 is a schematic cross-sectional structural diagram of an electronic device according to still other embodiments of this application.

In some embodiments, FIG. 8 is a schematic cross-sectional structural diagram of an electronic device 100 according to still other embodiments of this application. A difference between the electronic device 100 shown in this embodiment and the electronic device 100 shown in FIG. 4 lies in that: the second heat transfer assembly 50 in the electronic device 100 shown in this embodiment further includes a third heat conducting medium 55 and a fourth heat conducting medium 56. The third heat conducting medium 55 is arranged between a region where the heating device 30 on the circuit board 60 is located and the second shielding cover 51. The third heat conducting medium 55 is configured to transfer heat of the region where the heating device 30 on the circuit board 60 is located to the second shielding cover 51. The fourth heat conducting medium 56 is arranged between the second shielding cover 51 and the circuit board bracket 52. The fourth heat conducting medium 56 further transfers the heat of the second shielding cover 51 to the circuit board bracket 52.

The third heat conducting medium 55 and the fourth heat conducting medium 56 include but are not limited to heat conducting gel, heat conducting silicone grease, liquid metal, graphite, graphene, copper, copper alloy, or the like. This is not specifically limited in this application.

In some embodiments, referring to FIG. 4 or FIG. 8, the second heat transfer assembly 50 further includes a second heat conducting member 53. The second heat conducting member 53 is arranged between the circuit board bracket 52 and the second surface component 20. The second heat conducting member 53 is configured to transfer heat of the circuit board bracket 52 to the second surface component 20.

Figure 9:
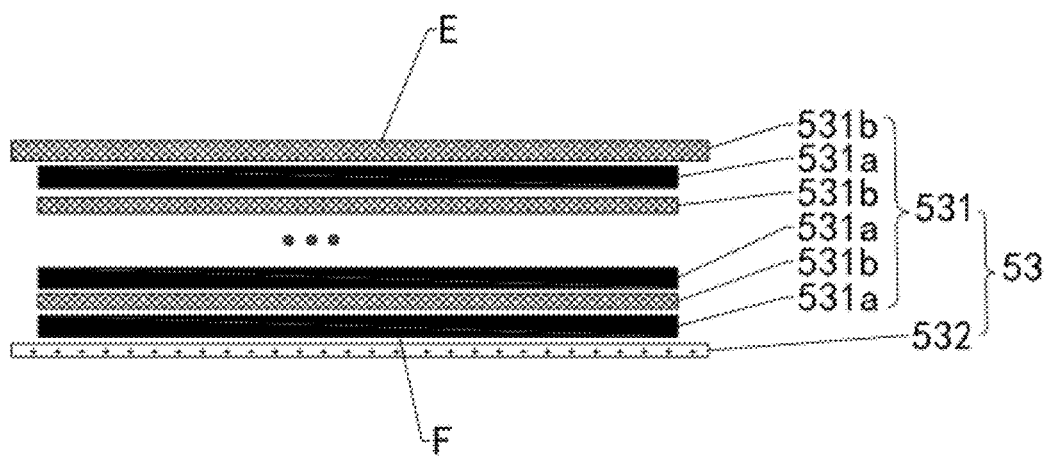
FIG. 9 is a schematic structural diagram of a second heat conducting member in the electronic device shown in FIG. 4 or FIG. 8.

In some embodiments, a structural form of the second heat conducting member 53 is similar to a structural form of the first heat conducting member 46. Specifically, FIG. 9 is a schematic structural diagram of the second heat conducting member 53 in the electronic device 100 shown in FIG. 4 or FIG. 8. The second heat conducting member 53 includes a second stack structure 531, and the second stack structure 531 is formed by second heat conducting material layers 531a and first adhesive layers 531b that are alternately arranged in sequence.

A material of the second heat conducting material layer 531a includes but is not limited to at least one of graphite, graphene, copper, or copper alloy. A material of the second adhesive layer 531b includes but is not limited to at least one of a double-sided adhesive or a liquid adhesive.

The second adhesive layer 531b has heat conducting performance, but a heat conduction coefficient of the second adhesive layer 531b is less than a heat conduction coefficient of the second heat conducting material layer 531a. In this way, heat on the second heat conducting material layer 531a can be better spread on a plane where the second heat conducting material layer 531a is located, to turn a point heat source into a surface heat source, thereby improving uniformity of heat that is transferred to different regions of the second surface B.

With an increase in a quantity of the second heat conducting material layer 531a and the second adhesive layer 531b, the uniformity is more desirable. In addition, in a case that the second heat conducting material layer 531a is made of graphite or graphene with a relatively high heat conduction coefficient, a capability of the heat to be spread on the plane where the second heat conducting material layer 531a is located is better, and heat uniformity of the second heat conducting member 53 can be further improved.

Still referring to FIG. 9, an end portion of the second stack structure 531 in a direction in which the second heat conducting material layers 531a and the second adhesive layers 531b are stacked is formed by the second adhesive layer 531b. In this way, the second stack structure 531 may be adhered to the circuit board bracket 52 or the second surface component 20 through the second adhesive layer 531b that forms the end portion of the second stack structure 531.

In some embodiments, still referring to FIG. 9, the second adhesive layer 531b that forms the end portion of the second stack structure 531 includes a fifth surface E, and the fifth surface E forms an outer surface of the second stack structure 531. Based on this, the second stack structure 531 further includes a sixth surface F opposite to the fifth surface E. The second heat conducting member 53 further includes a second protective layer 532. A material of the second protective layer 532 includes but is not limited to polyethylene terephthalate (polyethylene terephthalate, PET) and polypropylene (polypropylene, PP). The second protective layer 532 is arranged on the sixth surface F of the second stack structure 531. The second protective layer 532 is configured to protect the second stack structure 531, to prevent the second heat conducting material layer 531a inside the second heat conducting member 53 from being broken during transportation or assembly due to an external acting force.

In some embodiments, still referring to FIG. 9, both an area of the second protective layer 532 and an area of the second adhesive layer 531b where the fifth surface E is located are greater than an area of the second heat conducting material layer 531a, to respectively form an edge covering protective layer and an edge covering adhesive layer. In this way, the second heat conducting material layer 531a can be further protected, thereby lowering a broken risk of the second heat conducting material layer 531a.

In some embodiments, still referring to FIG. 4 or FIG. 8, the second heat transfer assembly 50 further includes a second buffer layer 54. The second buffer layer 54 is arranged between the second heat conducting member 53 and the second surface component 20. The second buffer layer 54 is configured to protect the circuit board 60 and electronic devices connected to the circuit board through buffering and absorb impact. Optionally, a material of the second buffer layer 54 includes but is not limited to foam.

According to the descriptions of the foregoing embodiments, the second heat transfer assembly 50 may include the circuit board 60, the second shielding cover 51, the circuit board bracket 52, the third heat conducting medium 55, the fourth heat conducting medium 56, the second heat conducting member 53, and the second buffer layer 54. A path along which heat is transferred from the heating device 30 to the second surface component 20 through the second heat transfer assembly 50 is specifically as follows: the heating device 30→the circuit board 60→the third heat conducting medium 55→the second shielding cover 51→the fourth heat conducting medium 56→the circuit board bracket 52→the second heat conducting member 53→the second buffer layer 54→the second surface component 20. Heat is conducted between two adjacent components mainly by enabling the two adjacent components to be in contact with each other. Certainly, there may also be a small amount of heat to be transferred through heat radiation. In some embodiments, the second heat transfer assembly 50 may not be arranged with one or more of the circuit board 60, the second shielding cover 51, the circuit board bracket 52, the third heat conducting medium 55, the fourth heat conducting medium 56, the second heat conducting member 53, and the second buffer layer 54, and/or the second heat transfer assembly 50 may further include another layer. This is not specifically limited in this application.

Two heat transfer paths, that is, the heat transfer path one L1 and the heat transfer path two L2, of the heating device 30 in the electronic device 100 are respectively described above. It should be noted that, in addition to the two heat transfer paths, the heating device 30 may have a heat transfer path three, a heat transfer path four, a heat transfer path five, and the like. This is not specifically limited in this application.

Figure 10A:
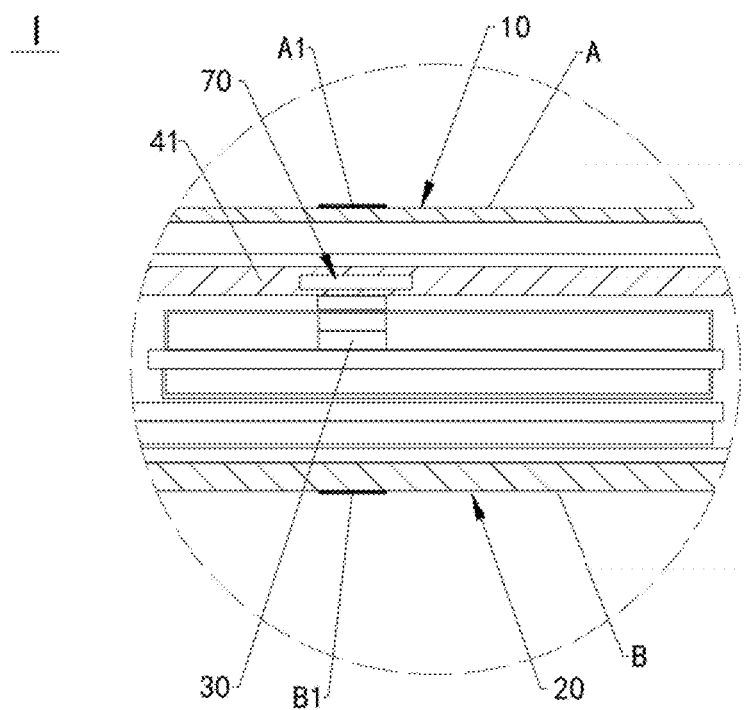
FIG. 10a is a schematic cross-sectional structural diagram of an electronic device according to still other embodiments of this application.

In some embodiments, FIG. 10a is a schematic cross-sectional structural diagram of an electronic device 100 according to still other embodiments of this application. A difference between the electronic device 100 shown in this embodiment and the electronic device 100 shown in FIG. 4 lies in that: in this embodiment, a heat insulation structure 70 is arranged in the first heat transfer assembly 40 in the heat transfer path L1. Optionally, the heat insulation structure 70 is arranged in the middle frame 41 of the first heat transfer assembly 40. The heat insulation structure 70 can insulate heat.

An orthographic projection of the heat insulation structure 70 on the first surface A overlaps with an orthographic projection of the heating device 30 on the first surface A. "Overlapping" includes four meanings: totally overlapping, a part overlapping with a whole, a whole overlapping with a part, and a part overlapping with a part. "Totally overlapping" indicates that areas of two are equal and edge contours of the two coincide with each other.

In a case that the whole orthographic projection of the heat insulation structure 70 on the first surface A overlaps with a part of the orthographic projection of the heating device 30 on the first surface A, or a part of the orthographic projection of the heat insulation structure 70 on the first surface A overlaps with a part of the orthographic projection of the heating device 30 on the first surface A, there may be one or more heat insulation structures 70 to be arranged in a plane parallel to the middle frame 41. FIG. 10a only shows an example in which there is one heat insulation structure 70 to be arranged in the plane parallel to the middle frame 41.

Figure 10B:
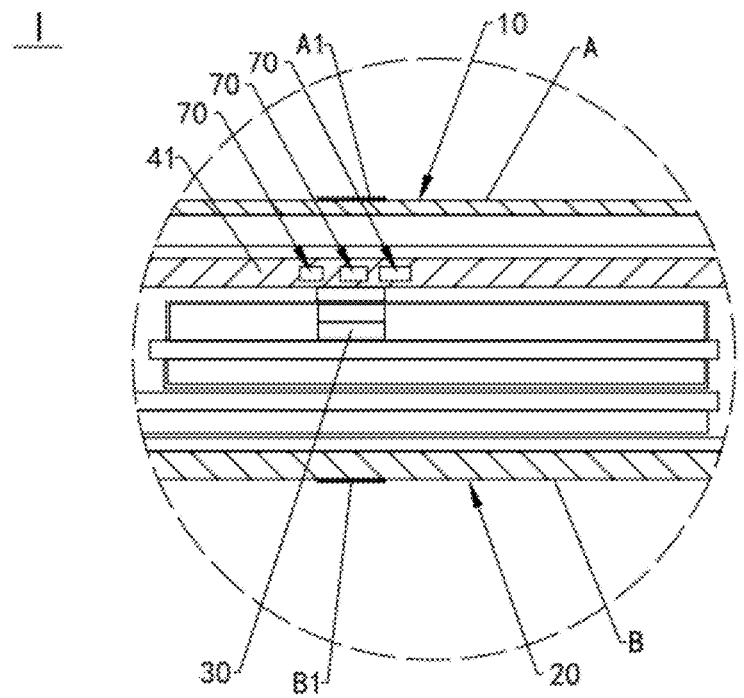
FIG. 10b is a schematic cross-sectional structural diagram of an electronic device according to still other embodiments of this application.

In some other embodiments, FIG. 10b is a schematic cross-sectional structural diagram of an electronic device 100 according to still other embodiments of this application. In this embodiment, there are a plurality of heat insulation structures 70 to be arranged in the plane parallel to the middle frame 41. The plurality of heat insulation structures 70 may be arranged in a row or may be arranged in an array. The plurality of heat insulation structures 70 are configured to block heat generated by the same heating device 30. That is, whole orthographic projections of the plurality of heat insulation structures 70 on the first surface A respectively overlap with a plurality of parts of the orthographic projection of the heating device 30 on the first surface A, or parts of the orthographic projections of the plurality of heat insulation structures 70 on the first surface A respectively overlap with a plurality of parts of the orthographic projection of the heating device 30 on the first surface A.

For ease of description, the following embodiments are all described on the basis that there is one heat insulation structure 70 to be arranged in the plane parallel to the middle frame 41.

In this way, by arranging the heat insulation structure 70, a speed at which the heat of the heating device 30 is transferred to the first surface component 10 along a shortest branch path perpendicular to the first surface A in the heat transfer path one L1 can be decreased.

Therefore, on one hand, more of the heat produced by the heating device 30 is transferred along another heat transfer path (for example, the heat transfer path two L2) of the heating device 30, to accelerate a speed at which the heat is transferred to another outer surface (for example, the second surface B) of the electronic device 100. In this way, a purpose of adjusting heat transfer speeds of a plurality of heat transfer paths can be achieved, which can reduce differences between the heat transfer speeds of the plurality of heat transfer paths, and enable the heat of the heating device 30 to be uniformly transferred to the plurality of outer surfaces of the electronic device, thereby improving heat dissipation efficiency, avoiding heat concentration, and improving the heat experience of the user.

On the other hand, more of the heat produced by the heating device 30 is transferred along another branch path around the shortest branch path in the heat transfer path one L1, to accelerate a speed at which heat is transferred to another region around a region on the first surface A and right opposite to the heating device 30. In this way, uniformity of heat that is transferred to various regions on the first surface A is improved, thereby further improving the heat dissipation efficiency, avoiding heat concentration, and improving the heat experience of the user.

A shape of the heat insulation structure 70 in a cross section parallel to the first surface A may be a square, a circle, an ellipse, a triangle, a rhombus, a special shape, or the like. This is not specifically limited in this embodiment of this application.

To enable the heat insulation structure 70 to be arranged in a region that is on the component where the heat insulation structure is located and that is right opposite to the heating device 30, so that the heat insulation structure 70 can effectively insulate the heat generated by the heating device 30, in some embodiments, in the first heat transfer assembly 40, the component where the heat insulation structure 70 is located includes a first portion. An orthographic projection of the first portion on the first surface A is a first projection, and the orthographic projection of the heating device 30 on the first surface A is a second projection. The second projection is located in the first projection, and a distance between an edge of the second projection and an edge of the first projection is less than or equal to a preset threshold of a maximum width of the second projection. The heat insulation structure is arranged in the first portion. The preset threshold may be, for example, ¼, ⅓, ½, or the like of the maximum width of the second projection, or may be another value that meets a condition under which the heat of the heating device can be effectively conducted. In this way, the heat insulation structure 70 can be arranged in the region that is on the component where the heat insulation structure is located and that is right opposite to the heating device 30, so that the heat insulation structure 70 can effectively insulate the heat generated by the heating device 30.

Figure 11:
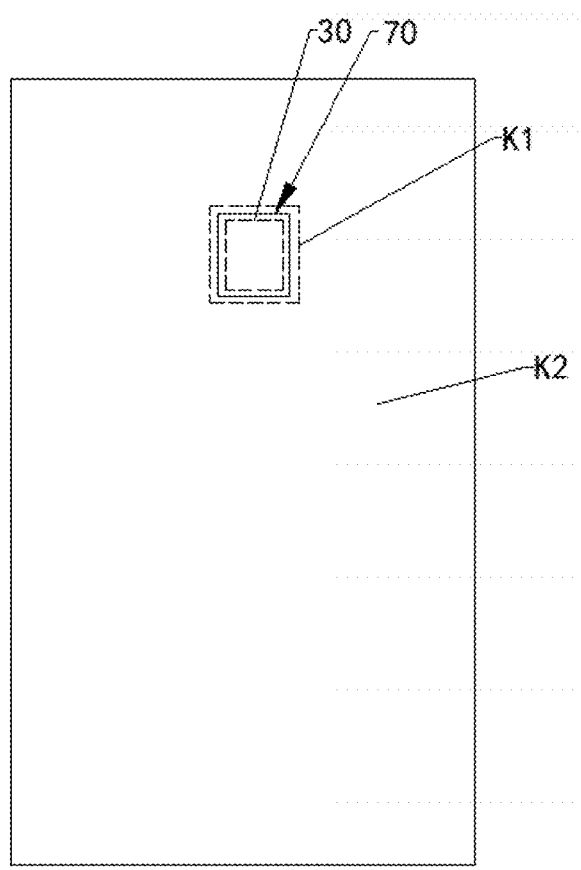
Figure 12:
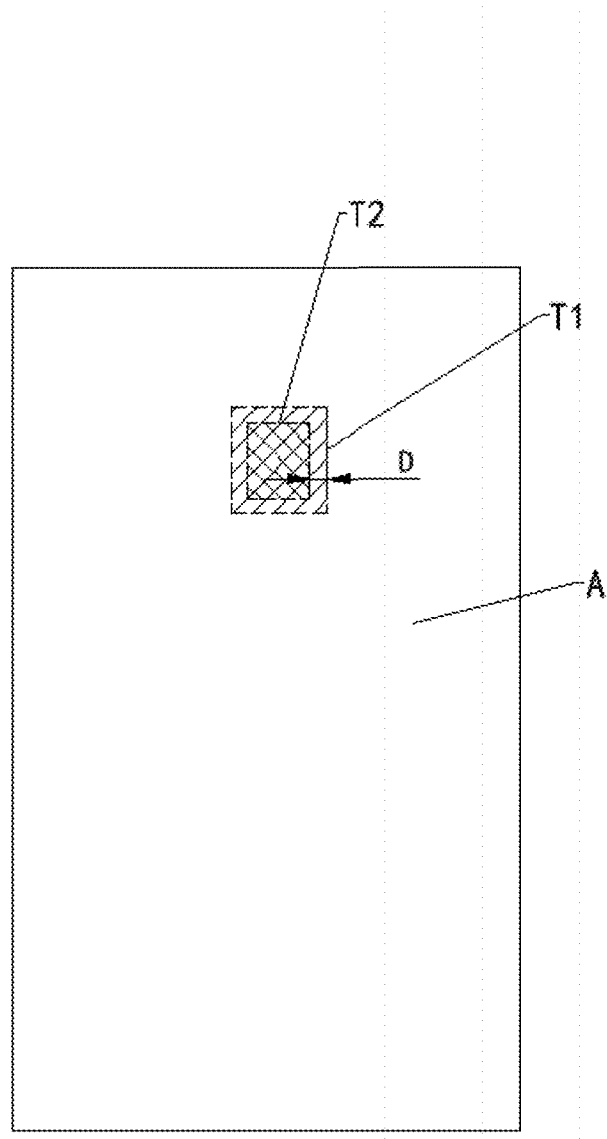

The foregoing implementation is described in detail below by using an example in which the component where the heat insulation structure 70 is located is the middle frame 41. Referring to FIG. 11 and FIG. 12, FIG. 11 is a front view of the middle frame 41 in the electronic device 100 shown in FIG. 10a, and FIG. 12 is a front view of the first surface component 10 in the electronic device 100 shown in FIG. 10a. In this embodiment, the middle frame 41 is the component where the heat insulation structure 70 is located. The middle frame 41 includes a first portion K1. An orthographic projection of the first portion K1 on the first surface A is a first projection T1 in FIG. 12 (referring to FIG. 12). An orthographic projection of the heating device 30 on the first surface A is a second projection T2 in FIG. 12. Focusing on FIG. 12, the second projection T2 is located in the first projection T1. A distance D between an edge of the second projection T2 and an edge of the first projection T1 is less than or equal to a preset threshold of a maximum width of the second projection T2. The heat insulation structure 70 is arranged in the first portion K1. The preset threshold may be, for example, ¼, ⅓, ½, or the like of the maximum width of the second projection, or may be another value that meets a condition under which the heat of the heating device can be effectively conducted.

It should be noted that the foregoing embodiment is merely described on the basis that the component where the heat insulation structure 70 is located is the middle frame 41. In a case that the component where the heat insulation structure 70 is located is the support structure in the display module 45 or the first adhesive layer 461b in the first heat conducting member 46, this embodiment is also applicable, and details are not described herein again.

Based on the foregoing embodiment, the component where the heat insulation structure 70 is located further includes a second portion. The second portion is a portion other than the first portion on the component where the heat insulation structure 70 is located, and no heat insulation structure 70 is arranged in the second portion. In this way, a heat conduction capability of the second portion is relatively good, and a relatively large amount of heat of the heating device 30 is conducted to another region around a region on the first surface A and right opposite to the heating device 30, thereby enabling a relatively good heat dissipation performance.

The following continues to use the example in which the component where the heat insulation structure 70 is located is the middle frame 41, to describe the foregoing implementation in detail. Still referring to FIG. 11, the middle frame 41 further includes a second portion K2. The second portion K2 is a portion other than the first portion K1 on the middle frame 41, and no heat insulation structure 70 is arranged in the second portion K2.

It should be noted that the foregoing embodiment is merely described on the basis that the component where the heat insulation structure 70 is located is the middle frame 41. In a case that the component where the heat insulation structure 70 is located is the support structure in the display module 45 or the first adhesive layer 461b in the first heat conducting member 46, the foregoing embodiment is also applicable, and details are not described herein again.

In some embodiments, referring to FIG. 10a again, the first surface A includes a first region A1, and the orthographic projection of the heating device 30 on the first surface A is the second projection, where the first region A1 overlaps with the second projection. The second surface B includes a second region B1, and an orthographic projection of the heating device 30 on the second surface B is a third projection, where the second region B1 overlaps with the third projection. A speed at which heat is transferred from the heating device 30 to the first region A1 is equal to a speed at which heat is transferred from the heating device 30 to the second region B1. In this way, a speed at which the heat generated during operation of the heating device 30 is transferred to the first surface A is equal to or approximately equal to a speed at which the heat generated by the heating device 30 is transferred to the second surface B, which can improve uniformity of the heat of the first surface A and the second surface B, thereby improving the heat dissipation efficiency, avoiding heat concentration, and improving the heat experience of the user.

The heat insulation structure 70 is a structure with relatively low heat transfer efficiency, and is not limited to a structure that does not transfer heat at all, provided that the heat transfer efficiency of the heat insulation structure 70 is lower than heat transfer efficiency of the component where the heat insulation structure 70 is located. For example, in the embodiments shown in FIG. 10a, the component where the heat insulation structure 70 is located is the middle frame 41, and the heat insulation structure 70 refers to a structure whose heat transfer efficiency is lower than that of the middle frame 41.

The heat insulation structure 70 includes but is not limited to one or more of a heat insulation air hole, heat insulation aerogel, asbestos, rock wool, ceramic fiber paper, fiberglass wool, silicate, and a vacuum plate.

In the embodiments shown in FIG. 10a, the heat insulation structure 70 is a heat insulation air hole, and the heat insulation air hole is filled with air, which is relatively low in cost and easy to be implemented. Certainly, the heat insulation air hole may alternatively be filled with gas such as nitrogen, oxygen, or carbon dioxide. This is not specifically limited in this application. A heat conduction coefficient of gas is relatively low, and therefore, a better heat insulation effect can be achieved. In addition, the gas is low in cost and easy to be implemented.

Figure 13:
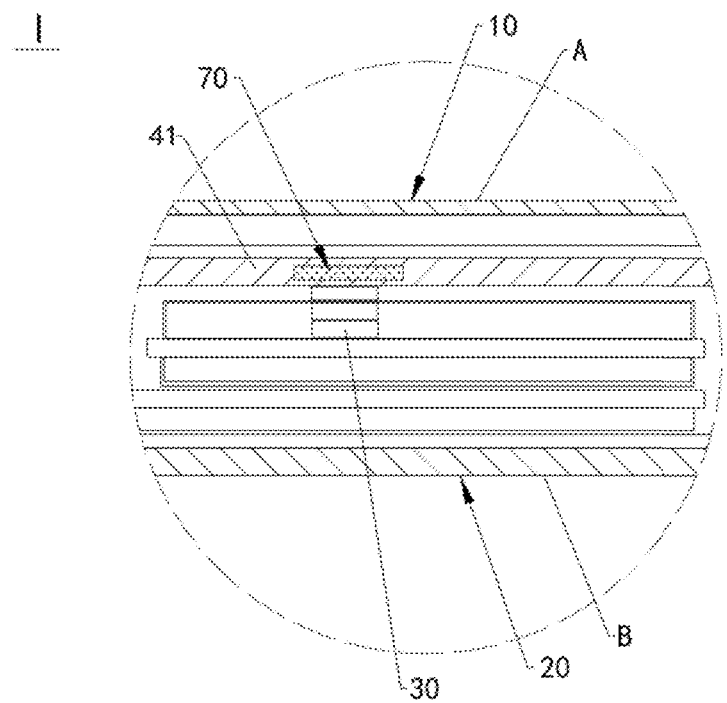
FIG. 13 is a schematic cross-sectional structural diagram of an electronic device according to still other embodiments of this application.

In some other embodiments, FIG. 13 is a schematic cross-sectional structural diagram of an electronic device 100 according to still other embodiments of this application. A difference between the electronic device 100 shown in this embodiment and the electronic device 100 shown in FIG. 10a lies in that: in this embodiment, the heat insulation structure 70 is formed by at least one solid insulating medium among heat insulation aerogel, asbestos, rock wool, ceramic fiber paper, fiberglass wool, silicate, and a vacuum plate. Compared with a gaseous insulating medium in the heat insulation air hole, heat conduction coefficients of various solid insulating media vary greatly, which can meet heat insulation requirements of various different scenarios.

Figure 14:
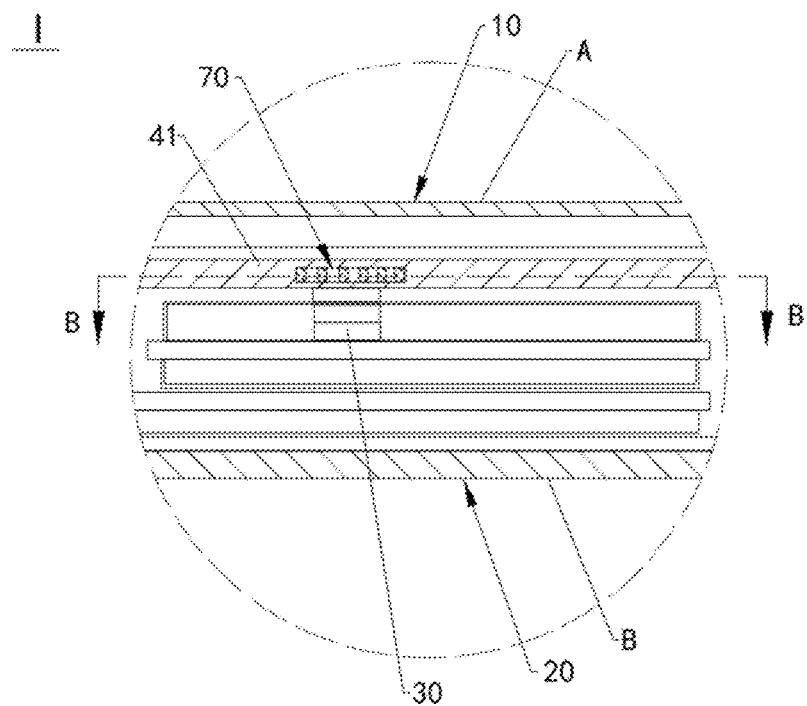
FIG. 14 is a schematic cross-sectional structural diagram of an electronic device according to still other embodiments of this application.

In some other embodiments, FIG. 14 is a schematic cross-sectional structural diagram of an electronic device 100 according to still other embodiments of this application. A difference between the electronic device 100 shown in this embodiment and the electronic device 100 shown in FIG. 10a lies in that: in this embodiment, the heat insulation structure 70 includes a solid insulating medium and a gaseous insulating medium. The solid insulating medium includes but is not limited to at least one of heat insulation aerogel, asbestos, rock wool, ceramic fiber paper, fiberglass wool, silicate, or a vacuum plate. The gaseous insulating medium includes but is not limited to air, nitrogen, oxygen, carbon dioxide, and the like.

Figure 15:
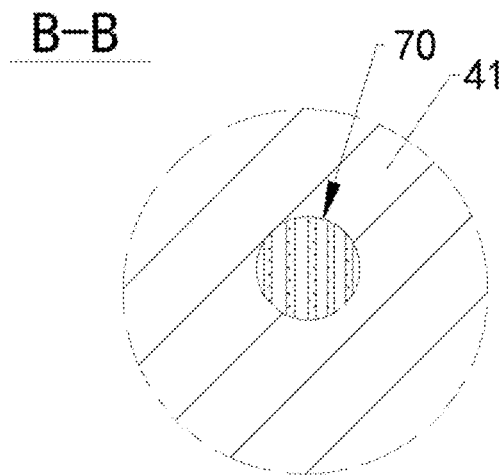
FIG. 15 is a schematic cross-sectional structural diagram of the electronic device shown in FIG. 14 taken along line B-B.

FIG. 15 is a schematic cross-sectional structural diagram of the electronic device 100 shown in FIG. 14 taken along line B-B. In this embodiment, solid insulating media are arranged to be in a grid shape, and a gaseous insulating medium is located between every two adjacent grids.

Figure 16:
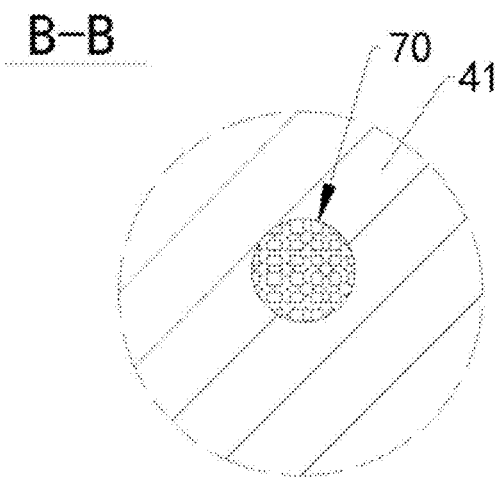
FIG. 16 is another schematic cross-sectional structural diagram of the electronic device shown in FIG. 14 taken along line B-B.

In some other embodiments, FIG. 16 is another schematic cross-sectional structural diagram of the electronic device 100 shown in FIG. 14 taken along line B-B. In this embodiment, the solid insulating media are arranged to be in a lattice shape, and the gaseous insulating media are located in the lattices.

It should be noted that in the heat insulation structure 70, the solid insulating media and the gaseous insulating media may be arranged in another manner. This is not specifically limited in this application.

In still some other embodiments, the heat insulation structure 70 may further include a liquid insulating medium, and the liquid insulating medium may be filled in an inner hole of the component where the heat insulation structure is located, or may be encapsulated in a separate container and then mounted in the component where the heat insulation structure is located. This is not specifically limited in this application.

The heat insulation structure 70 may be embedded into the component where the heat insulation structure is located, that is, an end of the heat insulation structure 70 close to the heating device 30, an end away from the heating device 30, and a periphery are all wrapped by a material of the component where the heat insulation structure is located.

For example, referring to FIG. 10a, in a case that the heat insulation structure 70 is arranged in the middle frame 41, the component where the heat insulation structure 70 is located is the middle frame 41 and the heat insulation structure 70 is embedded into the middle frame 41. That is, the end of the heat insulation structure 70 close to the heating device 30, the end away from the heating device 30, and the periphery are all wrapped by a material of the middle frame 41.

In this way, the heat insulation structure 70 does not extend beyond the surface of the component where the heat insulation structure is located, which can ensure consistency of appearance, the material, and a shape of the component where the heat insulation structure is located. In addition, in a case that the component where the heat insulation structure 70 is located is fixed to another surrounding component through an adhesive, an adhesion area can be enlarged, thereby ensuring fixing strength. In addition, under the premise that a thickness of the component where the heat insulation structure 70 is located is constant, the heat insulation structure 70 is embedded into the component where it the heat insulation structure is located, which can reduce a height occupied by the heat insulation structure 70 in the component where the heat insulation structure is located, thereby ensuring structural strength of the component where the heat insulation structure is located.

Figure 17:
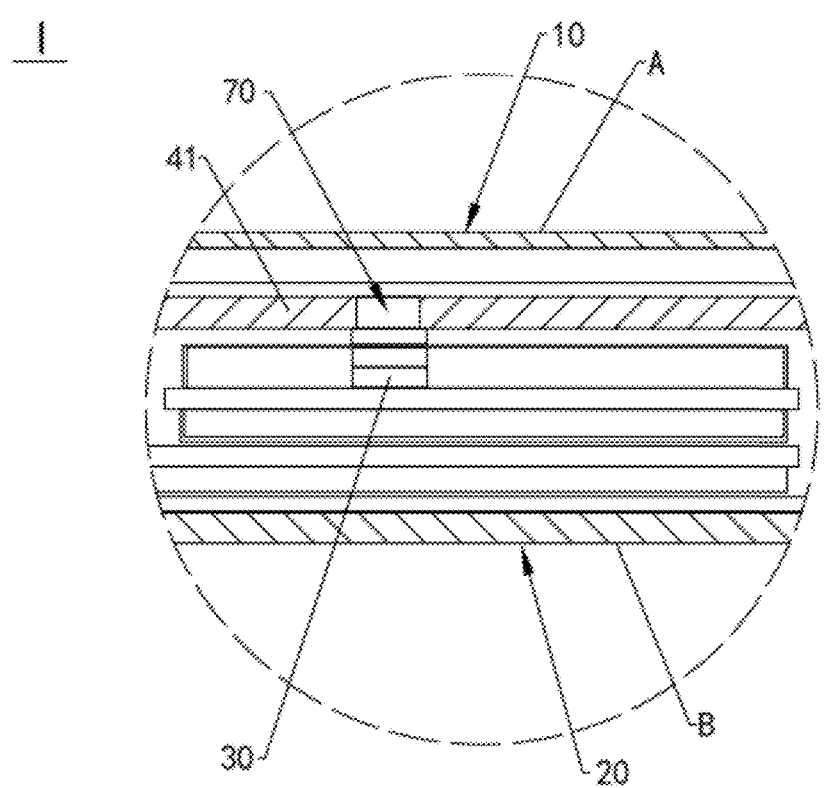
FIG. 17 is a schematic cross-sectional structural diagram of an electronic device according to still other embodiments of this application.

In still other embodiments, FIG. 17 is a schematic cross-sectional structural diagram of an electronic device 100 according to still other embodiments of this application. A difference between the electronic device 100 shown in this embodiment and the electronic device 100 shown in FIG. 10a lies in that: in this embodiment, the heat insulation structure 70 runs through surfaces that is on the component where the heat insulation structure is located and that are respectively close to the heating device 30 and away from the heating device 30. That is, the end of the heat insulation structure 70 close to the heating device 30 is located on the surface that is on the component where the heat insulation structure is located and that is close to the heating device 30, and the end of the heat insulation structure 70 away from the heating device 30 is located on the surface of that is on the component where the heat insulation structure is located and that is away from the heating device 30. In this way, in a case that the heat insulation structure 70 is a heat insulation air hole, the heat insulation air hole is a through hole, and it may also be considered that the heat insulation air hole is a recessed portion that is formed in a case that the surface that is on the component where the heat insulation structure is located and that is close to the heating device 30 is recessed towards the surface away from the heating device 30, where the recessed portion runs through the surface that is on the component where the heat insulation structure is located and that is away from the heating device 30, or it may be considered that the heat insulation air hole is a recessed portion that is formed in a case that the surface that is on the component where the heat insulation structure is located and that is away from the heating device 30 is recessed towards the surface close to the heating device 30, where the recessed portion runs through the surface that is on the component where the heat insulation structure is located and that is close to the heating device 30. Under the premise that a thickness of the component where the heat insulation structure is located is constant, a height of the heat insulation structure 70 is set to be relatively high, which can improve heat insulation performance, lower manufacturing difficulty, and enable costs to be relatively low.

Figure 18:
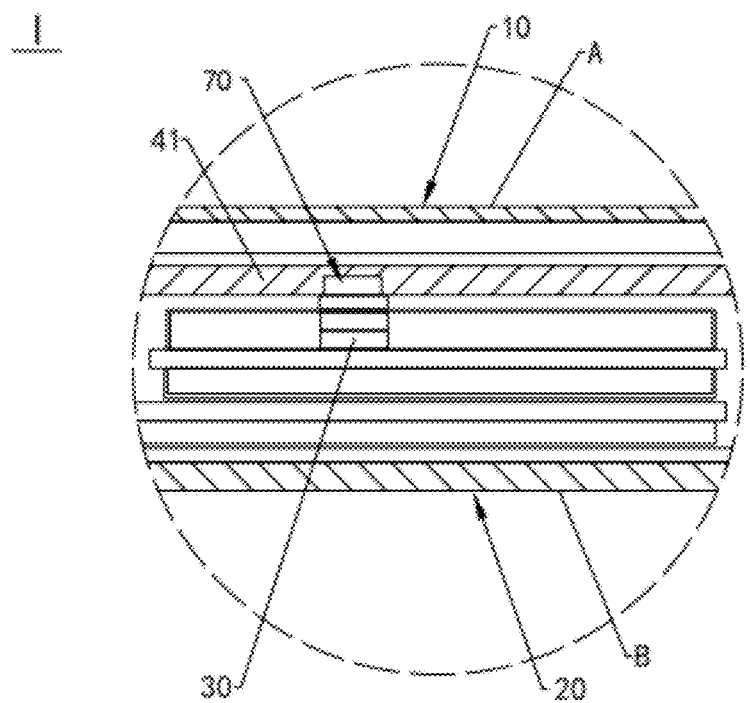
FIG. 18 is a schematic cross-sectional structural diagram of an electronic device according to still other embodiments of this application.

In still other embodiments, FIG. 18 is a schematic cross-sectional structural diagram of an electronic device 100 according to still other embodiments of this application. A difference between the electronic device 100 shown in this embodiment and the electronic device 100 shown in FIG.

10a lies in that: in this embodiment, the heat insulation structure 70 runs through the surface that is on the component where the heat insulation structure is located and that is close to the heating device 30, and does not run through the surface that is on the component where the heat insulation structure is located and that is away from the heating device 30. That is, the end of the heat insulation structure 70 close to the heating device 30 is located on the surface that is on the component where the heat insulation structure is located and that is close to the heating device 30, and the end of the heat insulation structure 70 away from the heating device 30 is wrapped by the material of the component where the heat insulation structure is located. In a case that the heat insulation structure 70 is a heat insulation air hole, the heat insulation air hole is a blind hole, and it may also be considered that the heat insulation air hole is a recessed portion that is formed in a case that the surface that is on the component where the heat insulation structure is located and that is close to the heating device 30 is recessed towards the surface away from the heating device 30. In this way, the heat insulation performance of the heat insulation structure 70 can be ensured. Furthermore, consistency of a shape and a forming material of the surface that is on the component where the heat insulation structure is located and that is away from the heating device 30 can also be ensured, thereby ensuring adhesion performance, lowering manufacturing difficulty, and enabling costs to be relatively low.

Figure 19:
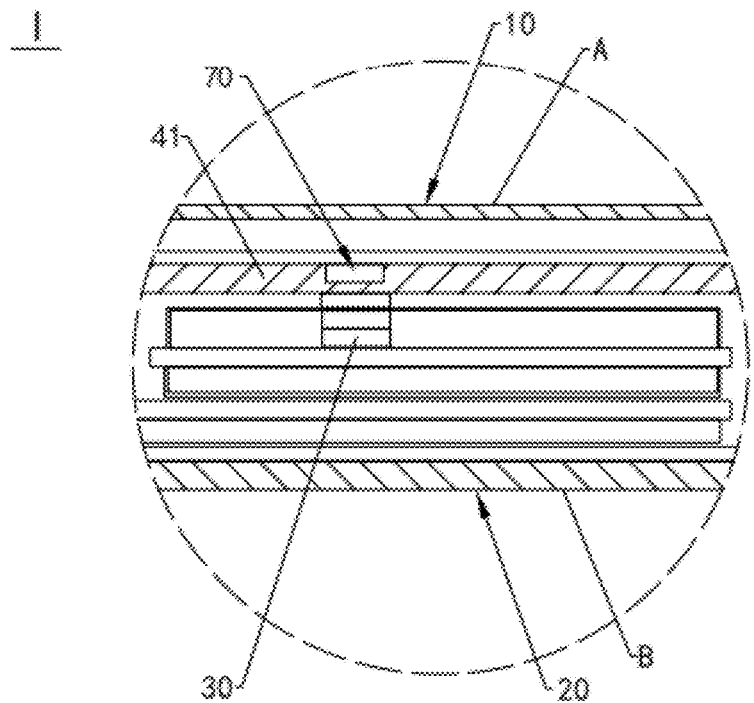
FIG. 19 is a schematic cross-sectional structural diagram of an electronic device according to still other embodiments of this application.

In still other embodiments, FIG. 19 is a schematic cross-sectional structural diagram of an electronic device 100 according to still other embodiments of this application. A difference between the electronic device 100 shown in this embodiment and the electronic device 100 shown in FIG. 10a lies in that: in this embodiment, the heat insulation structure 70 does not run through the surface that is on the component where the heat insulation structure is located and that is close to the heating device 30, and runs through the surface that is on the component where the heat insulation structure is located and that is away from the heating device 30. That is, the end of the heat insulation structure 70 away from the heating device 30 is located on the surface that is on the component where the heat insulation structure is located and that is close to the heating device 30, and the end of the heat insulation structure 70 close to the heating device 30 is wrapped by the material of the component where the heat insulation structure is located. In a case that the heat insulation structure 70 is a heat insulation air hole, the heat insulation air hole is a blind hole, and it may also be considered that the heat insulation air hole is a recessed portion that is formed in a case that the surface that is on the component where the heat insulation structure is located and that is away from the heating device 30 is recessed towards the surface close to the heating device 30. In this way, the heat insulation performance of the heat insulation structure 70 can be ensured. Furthermore, consistency of a shape and a forming material of the surface that is on the component where the heat insulation structure is located and that is close to the heating device 30 can also be ensured, thereby ensuring adhesion performance, lowering manufacturing difficulty, and enabling costs to be relatively low.

It should be noted that the foregoing descriptions for the arrangement positions of the heat insulation structure 70 in the component where the heat insulation structure is located are given on the basis that the heat insulation structure 70 is a heat insulation air hole. In a case that the heat insulation structure 70 is a solid insulating medium or a liquid insulating medium, there may also be a plurality of position arrangement manners as described above, and details are not described herein again. It should be noted that in a case that the heat insulation structure 70 is a liquid insulating medium, and at least one end of the heat insulation structure 70 forms an outer surface of the component where the heat insulation structure is located, the heat insulation structure 70 needs to be encapsulated in a container before being mounted into the component where the heat insulation structure is located.

The accompanying drawings of the foregoing embodiments are all described on the basis that the heat insulation structure 70 is arranged in the middle frame 41. The middle frame 41 is relatively thick and relatively good in structural strength, thereby providing a better arrangement condition for the heat insulation structure 70 and preventing the middle frame 41 from being deformed or broken during formation of the heat insulation structure 70 through processing. Certainly, the heat insulation structure 70 may alternatively be arranged in another structural component in the heat transfer path one L1.

Figure 20:
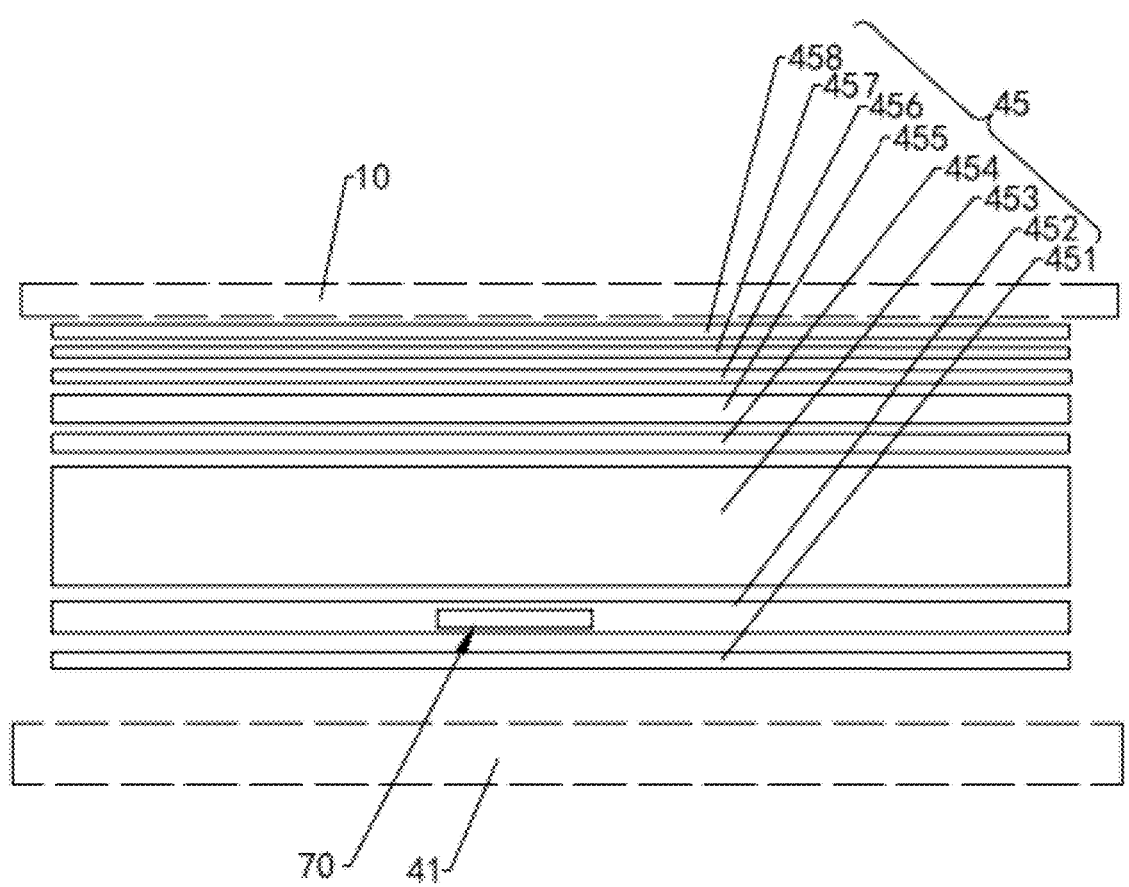
FIG. 20 is another schematic structural diagram of the display module in the electronic device shown in FIG. 4.

For example, FIG. 20 is another schematic structural diagram of the display module 45 in the electronic device 100 shown in FIG. 4. In this embodiment, the heat insulation structure 70 is arranged in the support layer 452 of the display module 45. In this way, the heat insulation structure 70 does not affect the display of the display panel 456.

Figure 21:
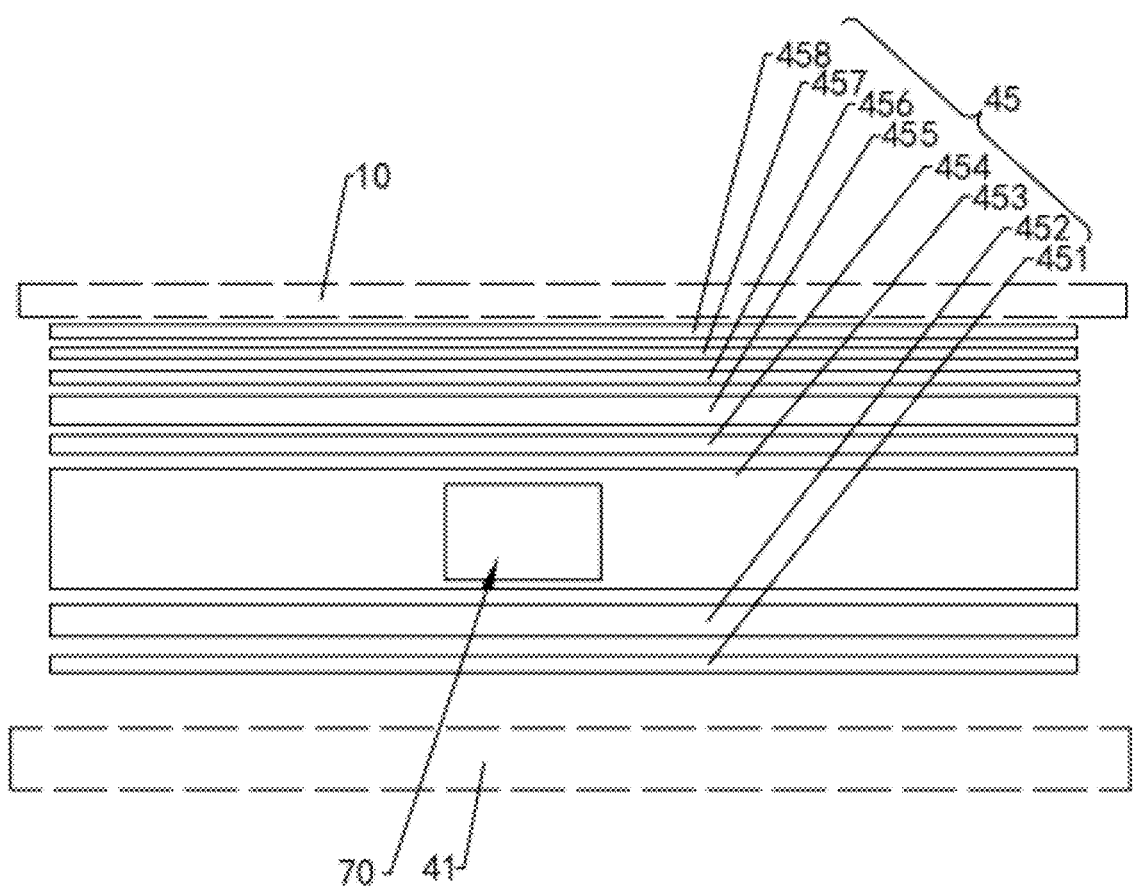
FIG. 21 is another schematic structural diagram of the display module in the electronic device shown in FIG. 4.

For another example, FIG. 21 is another schematic structural diagram of the display module 45 in the electronic device 100 shown in FIG. 4. In this embodiment, the heat insulation structure 70 is arranged in the buffer layer 453 of the display module 45. In this way, the heat insulation structure 70 does not affect the display of the display panel 456. In addition, the buffer layer 453 is usually made of a soft and elastic material such as foam, to facilitate processing of the heat insulation structure 70.

Figure 22:
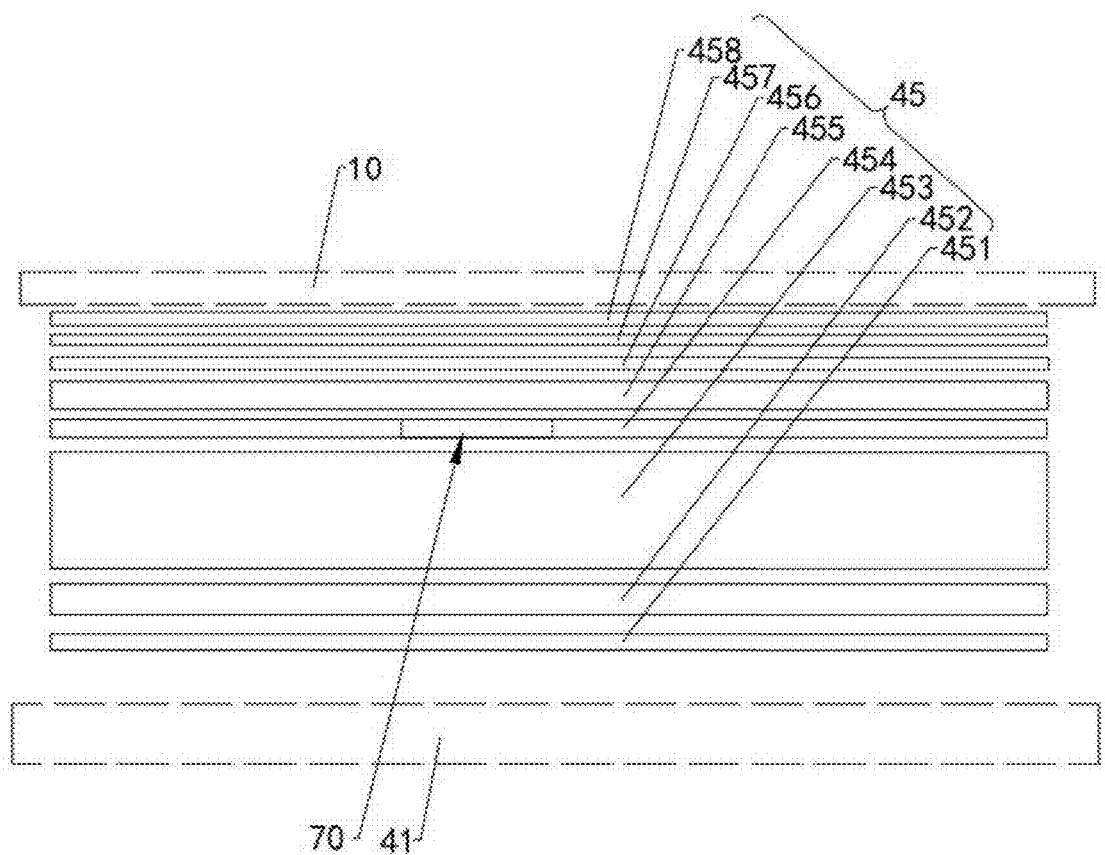
FIG. 22 is another schematic structural diagram of the display module in the electronic device shown in FIG. 4.

For another example, FIG. 22 is another schematic structural diagram of the display module 45 in the electronic device 100 shown in FIG. 4. In this embodiment, the heat insulation structure 70 is arranged in the flat layer 454 of the display module 45. In this way, the heat insulation structure 70 does not affect the display of the display panel 456.

Figure 23:
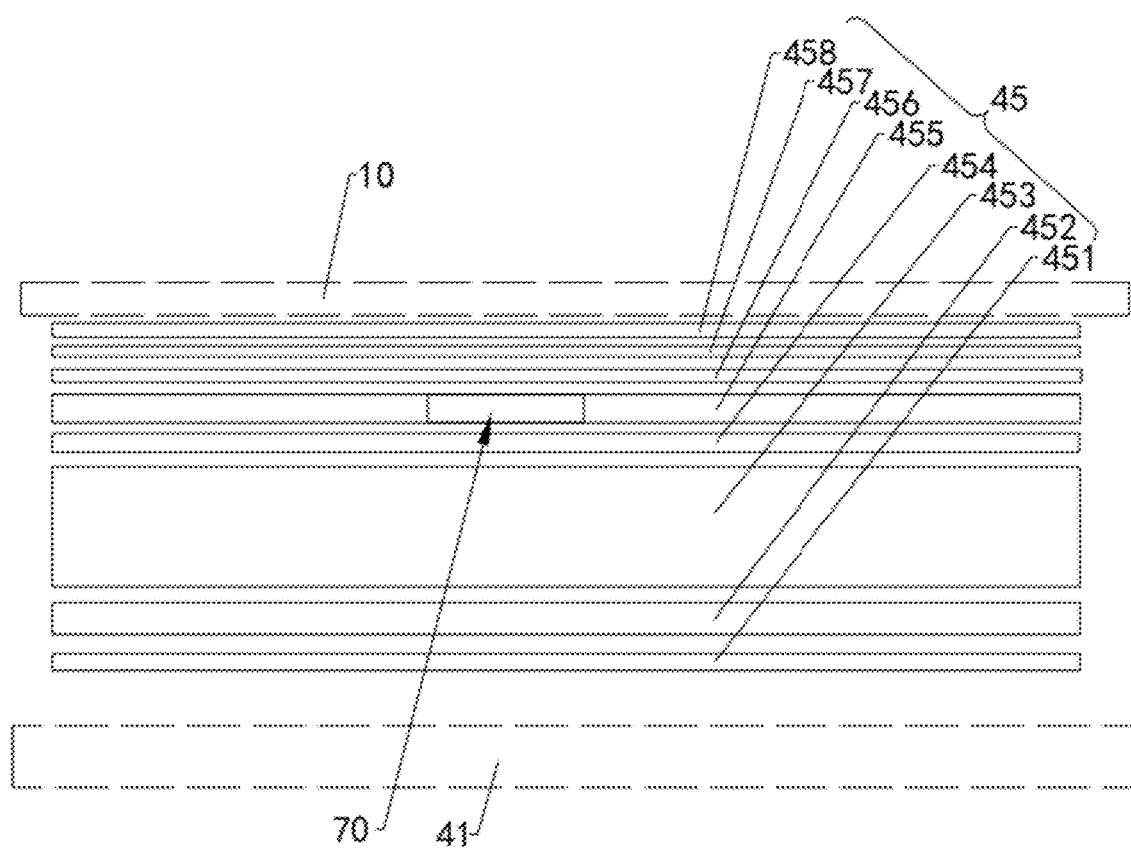
FIG. 23 is another schematic structural diagram of the display module in the electronic device shown in FIG. 4.

For another example, FIG. 23 is another schematic structural diagram of the display module 45 in the electronic device 100 shown in FIG. 4. In this embodiment, the heat insulation structure 70 is arranged in the protective layer 455 of the display module 45. In this way, the heat insulation structure 70 does not affect the display of the display panel 456.

Figure 24:
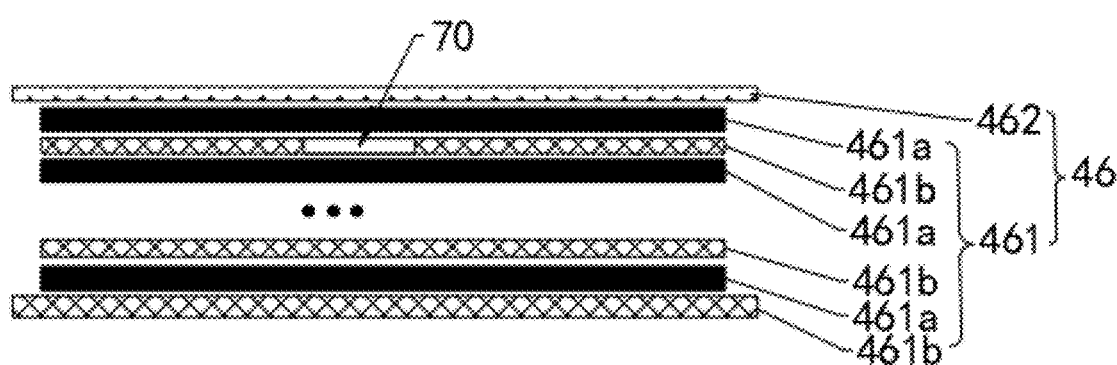
FIG. 24 is another schematic structural diagram of the third heat conducting medium in the electronic device shown in FIG. 4.
Figure 25:
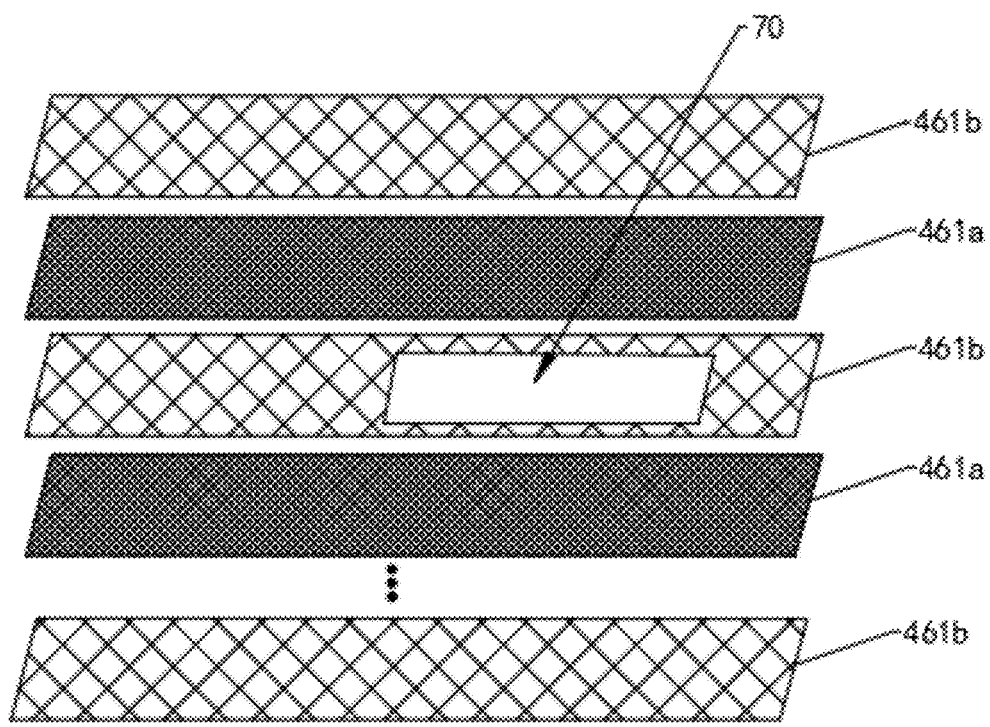
FIG. 25 is an exploded view of a first stack structure in the third heat conducting medium shown in FIG. 24.

For another example, FIG. 24 is another schematic structural diagram of the first heat conducting member 46 in the electronic device 100 shown in FIG. 4, and FIG. 25 is an exploded view of the first stack structure 461 in the first heat conducting member 46 shown in FIG. 24. In this embodiment, the heat insulation structure 70 is arranged in the first adhesive layer 461b of the first heat conducting member 46. In this way, more of the heat produced by the heating device 30 is transferred along another branch path around the shortest branch path in the heat transfer path one L1, and the heat is spread in the first heat conducting material layer 461a of the first heat conducting member 46 more uniformly, so that the heat is transferred to another larger region around the region on the first surface A and right opposite to the heating device 30, thereby further improving the uniformity of the heat that is transferred to various regions on the first surface A. There is no need to use high-priced graphene to manufacture the first heat conducting material layer 461a. Therefore, the costs are reduced while heat uniformity performance is ensured. Specifically, under the same thickness/shape, costs of using low-priced graphite to form the first heat conducting material layer 461*a* and arranging the heat insulation structure 70 in the first adhesive layer 461*b* are about ½ of costs of using graphene to form the first heat conducting material layer 461*a* without the heat insulation structure 70 being arranged.

Figure 26:
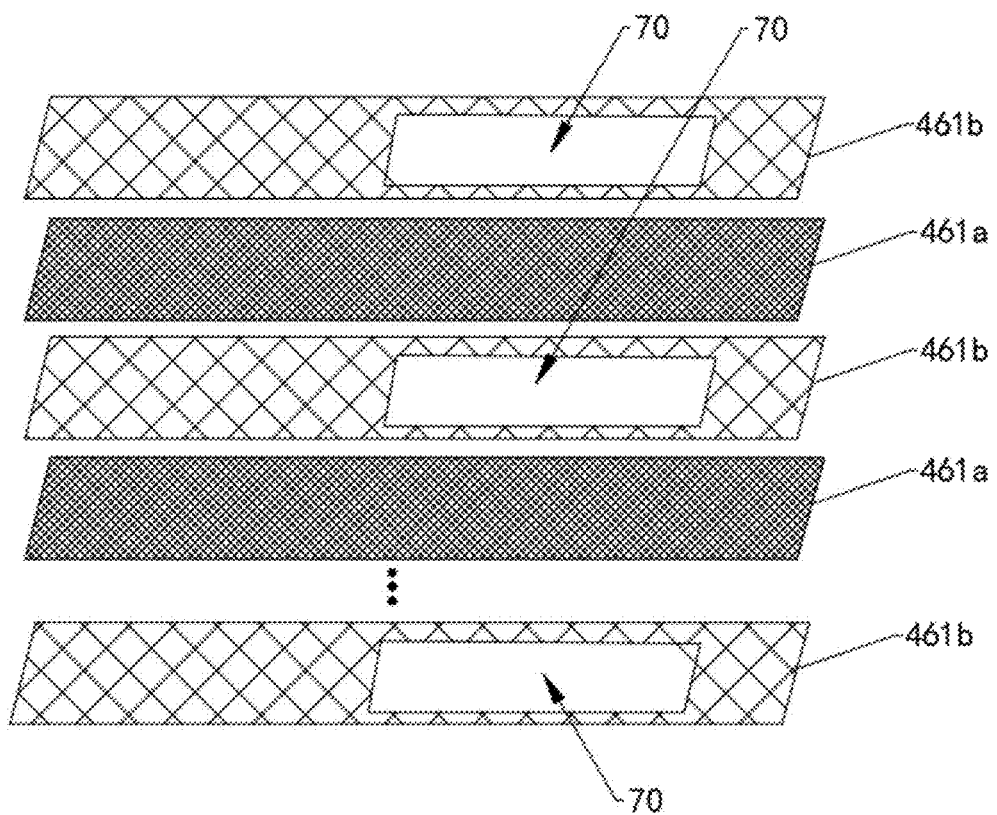
FIG. 26 is another exploded view of the first stack structure in the third heat conducting medium in the electronic device shown in FIG. 4.

In the foregoing embodiment, there may be a plurality of first adhesive layers 461*b* in the first heat conducting member 46. "Plurality of" means two or more. Based on this, there may be one or more heat insulation structures 70. In a case that there is one heat insulation structure 70, the heat insulation structure 70 is arranged in one of the plurality of first adhesive layers 461*b*, and in a case that there are a plurality of heat insulation structures 70, the plurality of heat insulation structures 70 are respectively arranged in the plurality of first adhesive layers 461*b*. Specifically, a quantity of the heat insulation structures 70 arranged in the first heat conducting member 46 may be selected according to a specific application scenario and with reference to a temperature difference between the first surface A and the second surface B, thereby achieving a purpose of adjusting the heat uniformity performance between the first surface A and the second surface B and between various regions on the first surface A. FIG. 24 and FIG. 25 merely show an example in which there is one heat insulation structure 70 and the heat insulation structure 70 is arranged in a first adhesive layer 461*b*. FIG. 26 is another exploded view of the first stack structure in the first heat conducting member 46 in the electronic device 100 shown in FIG. 4. In this embodiment, there are a plurality of heat insulation structures 70, and the plurality of heat insulation structures 70 are respectively arranged in a plurality of first adhesive layers 461*b*.

According to the foregoing descriptions, the heat insulation structure 70 may be arranged in at least one of the middle frame 41, and the support layer 452, the buffer layer 453, the flat layer 454, and the protective layer 455 of the display module 45, and the first adhesive layer 461*b* of the first heat conducting member 46. In addition, in a case that the heat insulation structure 70 is arranged in the support layer 452, the buffer layer 453, the flat layer 454, and the protective layer 455 of the display module 45, and in the first adhesive layer 461*b* or the first protective layer 462 of the first heat conducting member 46, an arrangement quantity, a size, a structural form, and an arrangement position of the heat insulation structure may be determined with reference to an arrangement quantity, a size, a structural form, and an arrangement position in a case that the heat insulation structure 70 is arranged in the middle frame 41, and details are not described herein again.

It should be noted that in addition to being arranged in the middle frame 41, and the support layer 452, the buffer layer 453, the flat layer 454, and the protective layer 455 of the display module 45, and the first adhesive layer 461*b* of the first heat conducting member 46, the heat insulation structure 70 may be arranged in at least one of the layers on the premise of not affecting or approximately not affecting functions of the first shielding cover 42, and the display panel 456, the polarizer 457, and the transparent adhesive layer 458 in the display module 45, and the first heat conducting material layer 461*a* and the first protective layer 462 of the first heat conducting member 46. This is not limited in this embodiment of this application.

It should be noted that the foregoing embodiment merely describes heat dissipation of one heating device 30. In the electronic device 100, there may also be a plurality of heating devices 30. In a case that there are a plurality of heating devices 30, the plurality of heating devices 30 may respectively be an SOC, a CPU, a CHG management chip, a power management chip, a RAM, and a ROM. In a case that there are a plurality of heating devices 30, heat dissipation efficiency of each of the heating devices 30 can be improved in the foregoing manner of arranging the heat insulation structure 70. Based on this, the same heat insulation structure 70 may be arranged for two or more heating devices 30, to improve the heat dissipation efficiency and lower structural complexity.

Figure 27:
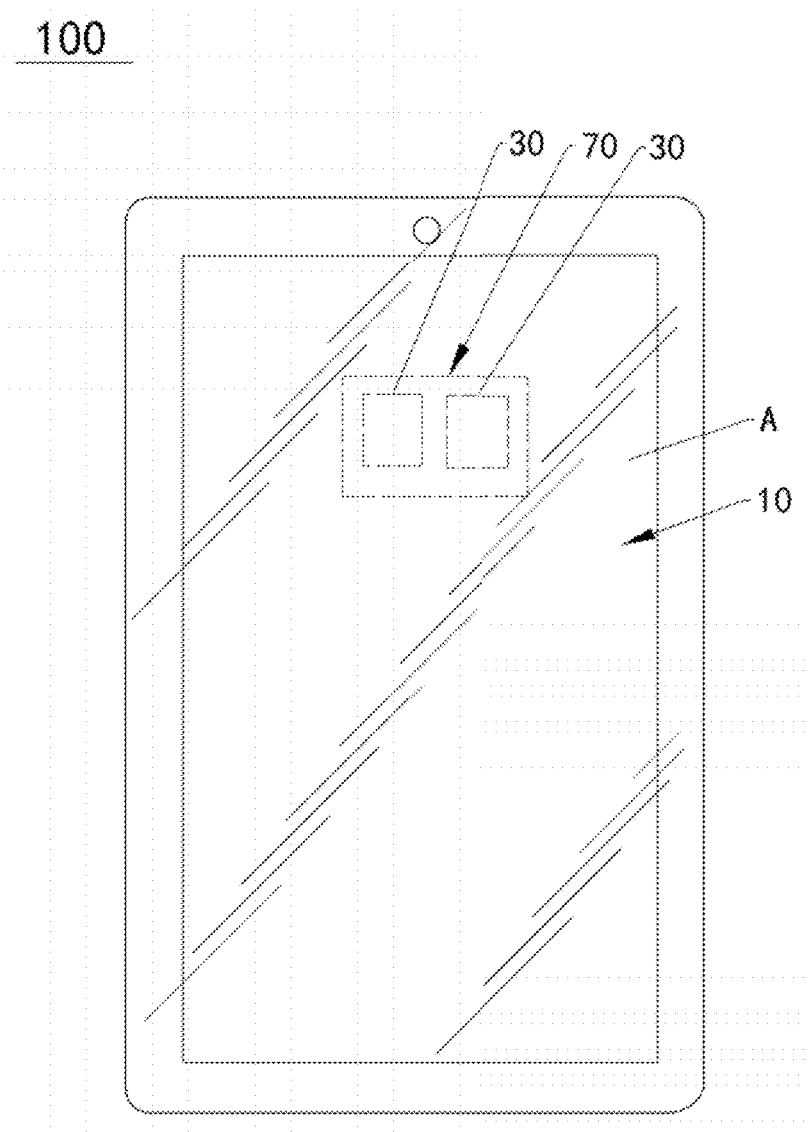
FIG. 27 is a front view of an electronic device according to some embodiments of this application.

For example, FIG. 27 is a front view of an electronic device 100 according to some embodiments of this application. In this embodiment, there are two heating devices 30, and the two heating devices 30 share one heat insulation structure 70. In this way, structural complexity of the component where the heat insulation structure 70 is located can be lowered.

Figure 28:
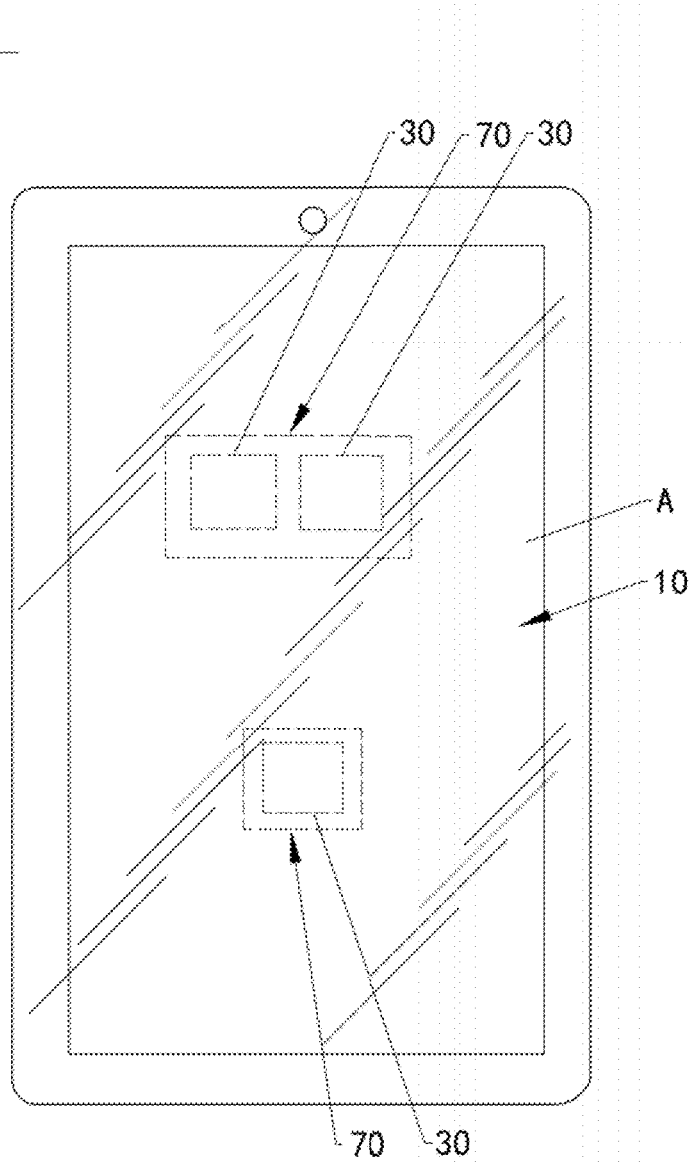
FIG. 28 is a front view of an electronic device according to still other embodiments of this application.

For another example, FIG. 28 is a front view of an electronic device 100 according to still other embodiments of this application. In this embodiment, there are three heating devices 30. Two of the three heating devices 30 that are relatively close to each other share one heat insulation structure 70, and another heating device 30 that is relatively far away from the foregoing two heating devices 30 corresponds to one heat insulation structure 70. In this way, on one hand, the structural complexity of the component where the heat insulation structure 70 is located can be lowered, and on the other hand, the structural strength of the component where the heat insulation structure 70 is located can be ensured.

According to the descriptions of the foregoing embodiments, the following verifies an impact of the heat insulation structure 70 on the uniformity of the heat of the first surface A and the second surface B through a simulation experiment.

Specifically, in this simulation experiment that is based on the electronic device 100 shown in FIG. 4, the heat insulation structure 70 is arranged in the heat transfer path one L1, specifically, the heat insulation structure 70 is arranged in the first adhesive layer 461*b* of the first heat conducting member 46 in the heat transfer path one L1, and a quantity of the heat insulation structures 70 arranged in the first adhesive layers 461*b* is adjusted, to gradually decrease a heat transfer coefficient along a direction perpendicular to the first surface A in the heat transfer path one L1. Temperature distribution diagrams of the first surface A and the second surface B of the electronic device 100 under various heat transfer coefficients obtained through simulation are shown in FIG. 29 to FIG. 32.

Figure 29:
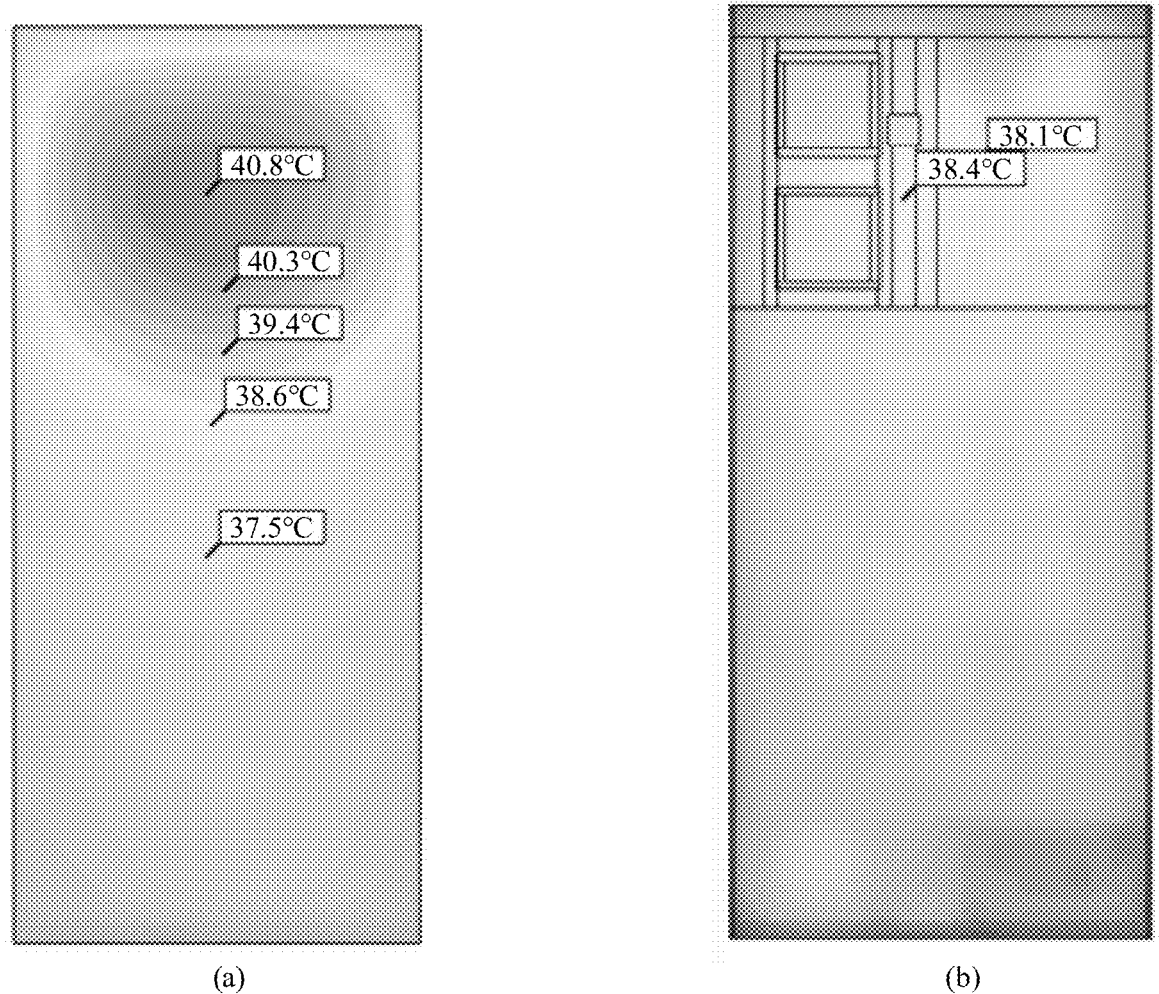
FIG. 29 shows heat distribution diagrams of a first surface and a second surface in a case that no heat insulation structure is arranged in the electronic device shown in FIG. 4.

Specifically, FIG. 29 shows heat distribution diagrams of the first surface A and the second surface B in a case that no heat insulation structure 70 is arranged in the electronic device 100 shown in FIG. 4. Specifically, (a) of FIG. 29 is the heat distribution diagram of the first surface A, and (b) of FIG. 29 is the heat distribution diagram of the second surface B. In this embodiment, in a case that the heat transfer coefficient along the direction perpendicular to the first surface A in the heat transfer path one L1 is 1, a maximum temperature of the first surface A is 40.8° C., a maximum temperature of the second surface B is 38.4° C., and a temperature difference is 2.4° C. Therefore, heat distribution uniformity is relatively poor and the heat dissipation efficiency is relatively low, thereby affecting the heat experience of the user.

Figure 30:
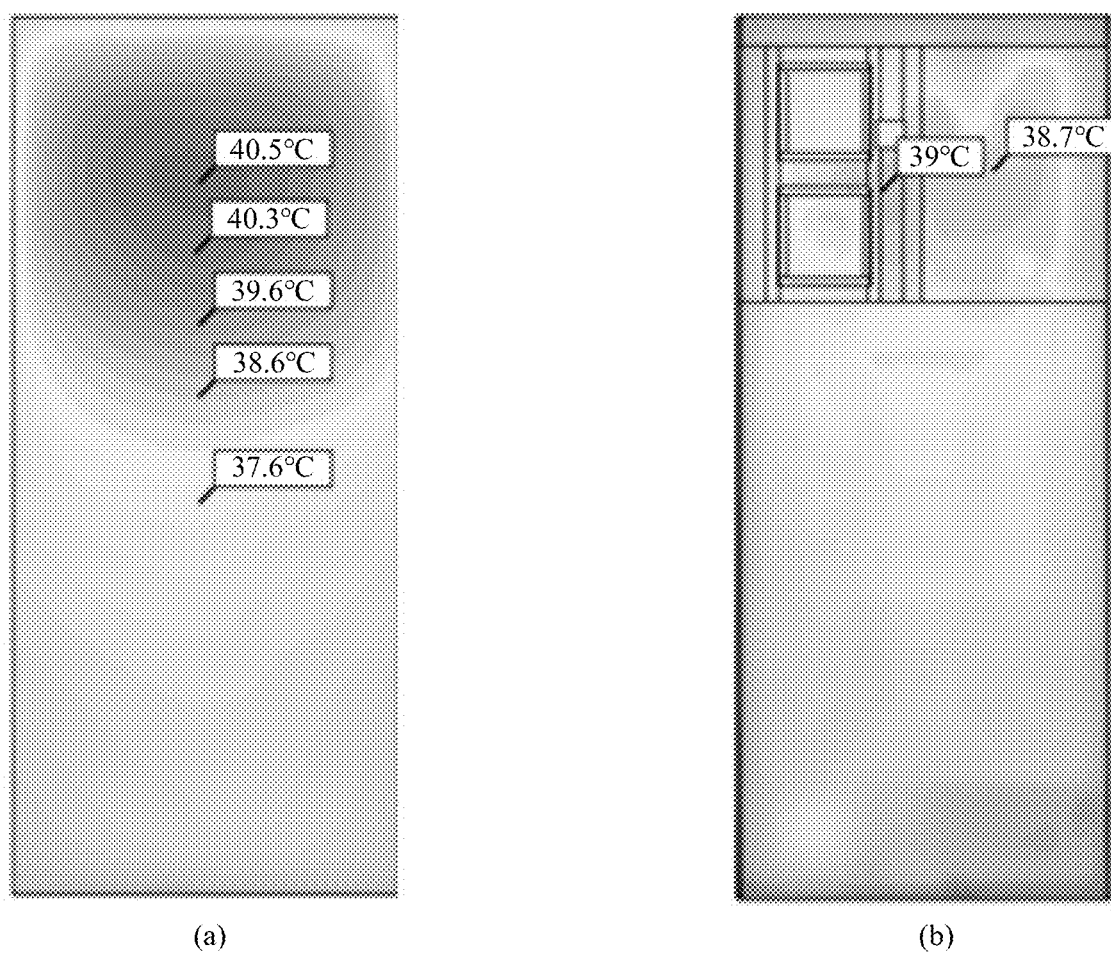
FIG. 30 shows heat distribution diagrams of the first surface and the second surface in a case that a heat insulation structure is arranged in the electronic device shown in FIG. 4 and a heat transfer coefficient along a direction perpendicular to the first surface in a heat transfer path one is set to be 0.1.

FIG. 30 shows heat distribution diagrams of the first surface A and the second surface B in a case that a heat insulation structure 70 is arranged in the electronic device 100 shown in FIG. 4 and the heat transfer coefficient along the direction perpendicular to the first surface A in the heat transfer path one L1 is set to be 0.1. Specifically, (a) of FIG. 30 is the heat distribution diagram of the first surface A, and (b) of FIG. 30 is the heat distribution diagram of the second surface B. In this embodiment, the maximum temperature of the first surface A is 40.5° C., the maximum temperature of the second surface B is 39° C., and the temperature difference is 1.5° C. In this case, the heat distribution uniformity is optimized, and the heat dissipation efficiency is improved to a certain extent, thereby improving the heat experience of the user.

Figure 31:
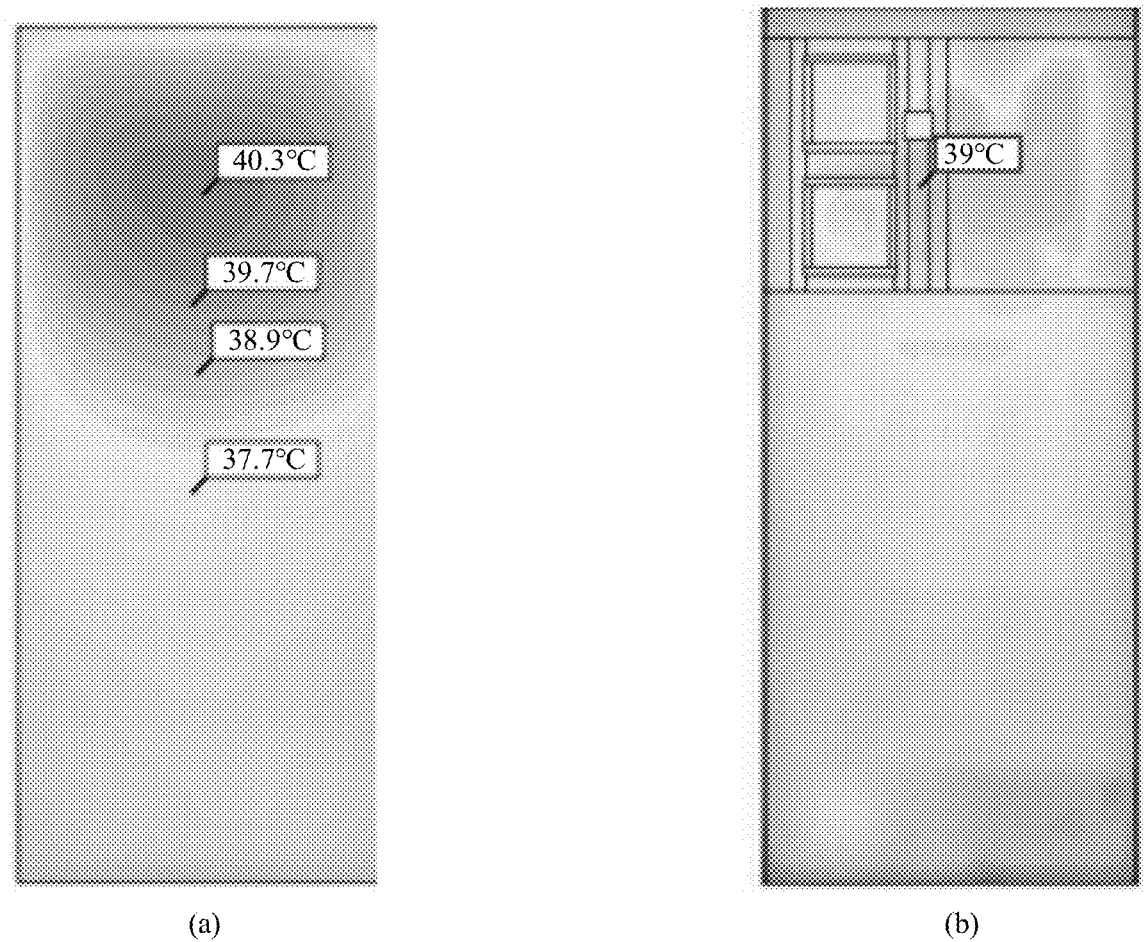
FIG. 31 shows heat distribution diagrams of the first surface and the second surface in a case that a heat insulation structure is arranged in the electronic device shown in FIG. 4 and the heat transfer coefficient along the direction perpendicular to the first surface in the heat transfer path one is set to be 0.06.

FIG. 31 shows heat distribution diagrams of the first surface A and the second surface B in a case that a heat insulation structure 70 is arranged in the electronic device 100 shown in FIG. 4 and the heat transfer coefficient along the direction perpendicular to the first surface A in the heat transfer path one L1 is set to be 0.06. Specifically, (a) of FIG. 31 is the heat distribution diagram of the first surface A, and (b) of FIG. 31 is the heat distribution diagram of the second surface B. In this embodiment, the maximum temperature of the first surface A is 40.3° C., the maximum temperature of the second surface B is 39° C., and the temperature difference is 1.3° C. In this case, the heat distribution uniformity is further optimized, and the heat dissipation efficiency is improved, thereby improving the heat experience of the user.

Figure 32:
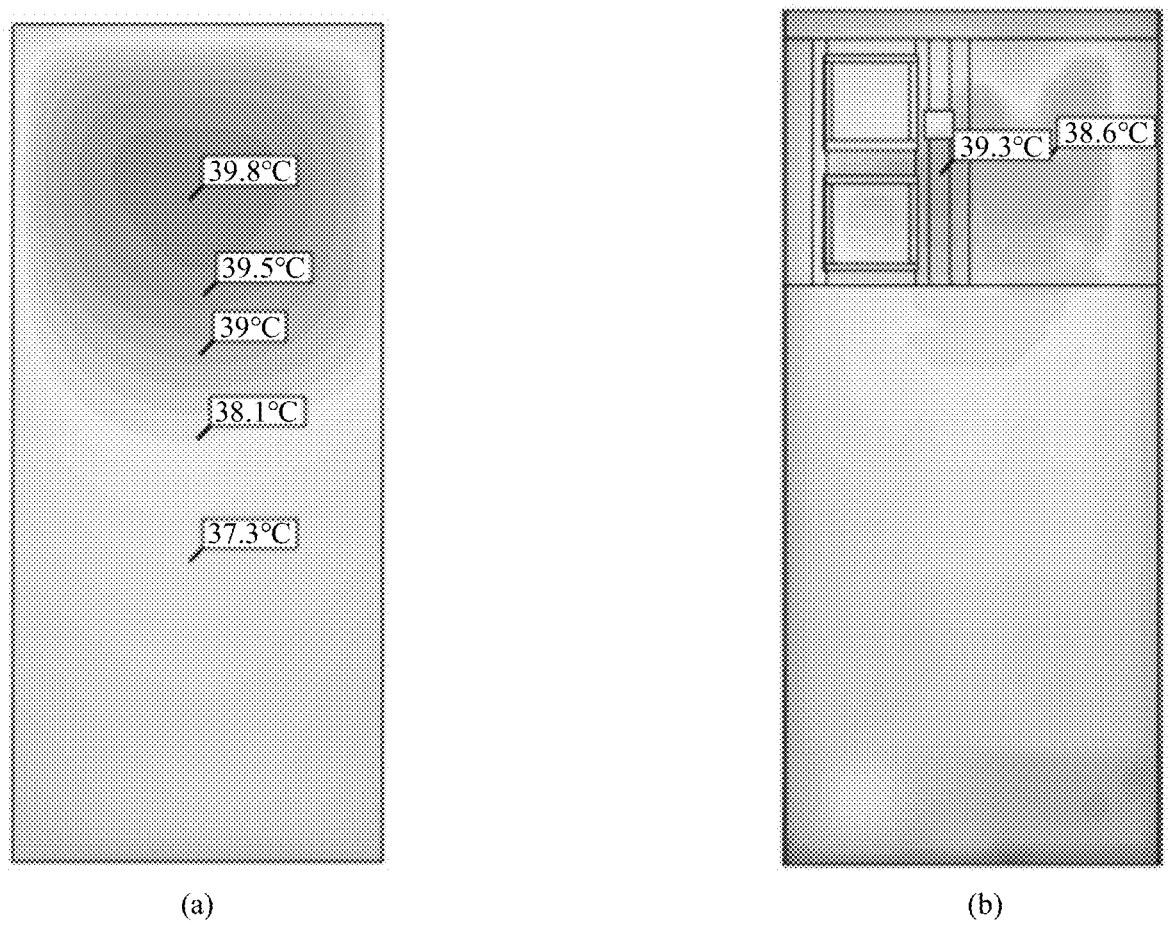
FIG. 32 shows heat distribution diagrams of the first surface and the second surface in a case that a heat insulation structure is arranged in the electronic device shown in FIG. 4 and the heat transfer coefficient along the direction perpendicular to the first surface in the heat transfer path one is set to be 0.02.

FIG. 32 shows heat distribution diagrams of the first surface A and the second surface B in a case that a heat insulation structure 70 is arranged in the electronic device 100 shown in FIG. 4 and the heat transfer coefficient along the direction perpendicular to the first surface A in the heat transfer path one L1 is set to be 0.02. Specifically, (a) of FIG. 32 is the heat distribution diagram of the first surface A, and (b) of FIG. 32 is the heat distribution diagram of the second surface B. In this embodiment, the maximum temperature of the first surface A is 39.8° C., the maximum temperature of the second surface B is 39.3° C., and the temperature difference is 0.5° C. In this case, the heat distribution uniformity is further optimized, and the heat dissipation efficiency is improved, thereby improving the heat experience of the user.

It can be learned from the simulation experiment diagrams shown in FIG. 29 to FIG. 32 that, by arranging the heat insulation structure 70 in the heat transfer path one L1, the distribution uniformity of the heat of the first surface A and the second surface B can be improved, and the heat dissipation efficiency can be increased, thereby improving the heat experience of the user.

Figure 33:
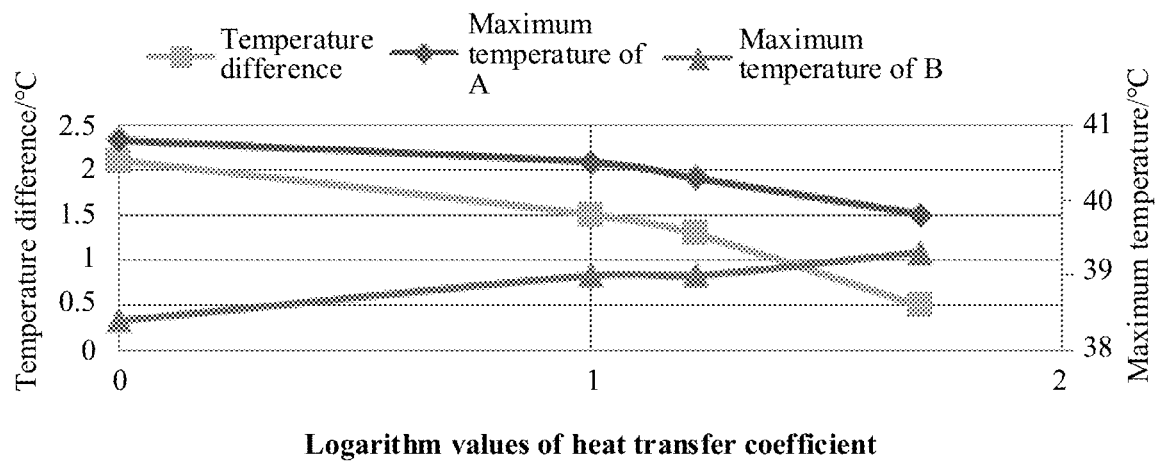
FIG. 33 is a curve diagram showing that maximum temperatures of a first surface and a second surface in an electronic device, and a temperature difference between the first surface and the second surface change with a heat transfer coefficient according to some embodiments of this application.

FIG. 33 is a curve diagram showing that maximum temperatures of a first surface A and a second surface B in an electronic device 100, and a temperature difference between the first surface A and the second surface B change with a heat transfer coefficient according to some embodiments of this application. In FIG. 33, horizontal coordinates are logarithm values of the heat transfer coefficient; left vertical coordinates are temperature differences in ° C.; and right vertical coordinates are maximum temperatures in ° C. It can be learned from FIG. 33 that within a certain range, as the quantity of the heat insulation structures 70 increases, the heat transfer coefficient along the direction perpendicular to the first surface A in the heat transfer path one L1 gradually decreases, and the difference between the first surface A and the second surface B decreases. In this case, the distribution uniformity of the heat becomes better. Based on this, a proper quantity of heat insulation structures 70 may be selected, to decrease the temperature difference between the first surface A and the second surface B as much as possible, thereby improving the distribution uniformity of the heat of the first surface A and the second surface B.

The foregoing describes the purpose of improving the uniformity of the heat of the first surface A and the second surface B by arranging the heat insulation structure 70 in the heat transfer path one L1. Based on this, at least one component in the heat transfer path two L2 may be replaced with a component with a higher heat conduction coefficient. For example, the material of the second heat conducting material layer in the second heat conducting member 53 in the heat transfer path two L2 is replaced with at least one of graphite or graphene with a higher heat conduction coefficient, to accelerate a heat transfer speed of the heat transfer path two L2, thereby further reducing a difference between a heat transfer speed of the heat transfer path one L1 and the heat transfer speed of the heat transfer path two L2, and enabling the heat to be transferred to the first surface A and the second surface B more uniformly.

Figure 34:
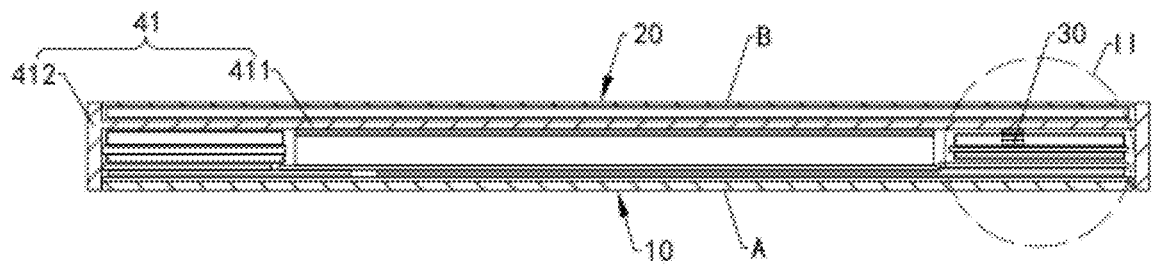
FIG. 34 is a schematic cross-sectional structural diagram of an electronic device according to still other embodiments of this application.
Figure 35:
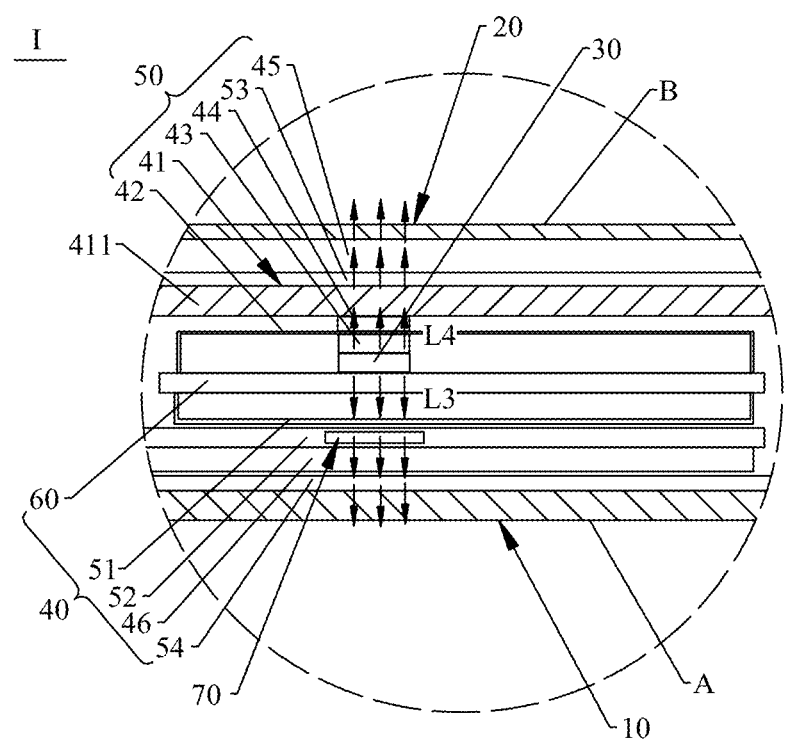
FIG. 35 is a partial enlarged view of a region II in the electronic device shown in FIG. 34.

Referring to FIG. 34 and FIG. 35, FIG. 34 is a schematic cross-sectional structural diagram of an electronic device 100 according to still other embodiments of this application, and FIG. 35 is a partial enlarged view of a region II in the electronic device 100 shown in FIG. 34. In this embodiment, the electronic device 100 is also a mobile phone. The first surface component 10 is a back cover, and the second surface component 20 is a front cover plate. The first surface component 10 includes a first surface A, and the second surface component 20 includes a second surface B. The first surface A is a bottom surface, and the second surface B is a top surface. In the electronic device 100, a heating device 30 includes at least two heat transfer paths. The two heat transfer paths are respectively the following heat transfer path three L3 and heat transfer path four L4.

The heat transfer path three L3: Heat generated during operation of the heating device 30 is transferred to the first surface component 10, and heat exchange occurs between the first surface A of the first surface component 10 and external air.

In some embodiments, there is a first heat conducting assembly 40 between the heating device 30 and the first surface component 10. The first heat conducting assembly 40 includes a circuit board 60, a second shielding cover 51, a circuit board bracket 52, a first heat conducting member 46, and a second buffer layer 54. A path along which the heat is transferred from the heating device 30 to the first surface component 10 through the first heat conducting assembly 40 is specifically as follows: the heating device 30→the circuit board 60→a third heat conducting medium 55→the second shielding cover 51→a fourth heat conducting medium 56→the circuit board bracket 52→the first heat conducting member 46→the second buffer layer 54→the first surface component 10. Heat is conducted between two adjacent components mainly by enabling the two adjacent components to be in contact with each other. Certainly, there may also be a small amount of heat to be transferred through heat radiation. In some embodiments, the first heat conducting assembly 40 may not be arranged with one or more of the circuit board 60, the second shielding cover 51, the circuit board bracket 52, the third heat conducting medium 55, the fourth heat conducting medium 56, the first heat conducting member 46 and the second buffer layer 54, and/or the first heat transfer assembly 40 may further include another layer. This is not specifically limited in this application.

In the foregoing embodiments, a structural form of the first heat conducting member 46 may be the same as the structural form of the first heat conducting member 46 shown in FIG. 6 or FIG. 7, and details are not described herein again.

The heat transfer path four L4: The heat generated during operation of the heating device 30 is transferred to the second surface component 20, and heat exchange occurs between the second surface B of the second surface component 20 and the external air.

In some embodiments, the heating device 30 is in direct contact with the second surface component 20 for heat conduction.

In some other embodiments, referring to FIG. 35, there is a second heat transfer assembly 50 between the heating device 30 and the second surface component 20, and the second heat transfer assembly 50 includes a middle frame 41, a first shielding cover 42, a first heat conducting medium 43, a second heat conducting medium 44, a display module 45, and a second heat conducting member 53. A path along which heat is transferred from the heating device 30 to the second surface component 20 through the second heat transfer assembly 50 is specifically as follows: the heating device 30→the first heat conducting medium 43→the first shielding cover 42→the second heat conducting medium 44→the middle frame 41→the second heat conducting member 53→the display module 45→the second surface component 20. Heat is conducted between two adjacent components mainly by enabling the two adjacent components to be in contact with each other. Certainly, there may also be a small amount of heat to be transferred through heat radiation. In some embodiments, the second heat transfer assembly 50 may not be arranged with one or more of the middle frame 41, the first shielding cover 42, the first heat conducting medium 43, the second heat conducting medium 44, the display module 45 and the second heat conducting member 53, and/or the second heat transfer assembly 50 may further include another layer. This is not specifically limited in this application.

In the foregoing embodiments, a structural form of the second heat conducting member 53 may be the same the structural form of the second heat conducting member 53 shown in FIG. 9, and details are not described herein again.

Still referring to FIG. 35, a heat insulation structure 70 is arranged in the first heat transfer assembly 40 in the heat transfer path three L3. Optionally, the heat insulation structure 70 is arranged in the circuit board bracket 52 in the first heat transfer assembly 40. The heat insulation structure 70 can insulate heat. An orthographic projection of the heat insulation structure 70 on the first surface A overlaps with an orthographic projection of the heating device 30 on the first surface A.

In this way, by arranging the heat insulation structure 70, a speed at which the heat of the heating device 30 is transferred to the first surface component 10 along a shortest branch path perpendicular to the first surface A in the heat transfer path three L3 can be decreased.

Therefore, on one hand, more of the heat produced by the heating device 30 is transferred along another heat transfer path (for example, the heat transfer path four L4) of the heating device 30, to accelerate a speed at which the heat is transferred to another outer surface (for example, the second surface B) of the electronic device 100. In this way, a purpose of adjusting heat transfer speeds of a plurality of heat transfer paths can be achieved, which can reduce differences between the heat transfer speeds of the plurality of heat transfer paths, and enable the heat of the heating device 30 to be uniformly transferred to the plurality of outer surfaces of the electronic device, thereby improving heat dissipation efficiency, avoiding heat concentration, and improving the heat experience of the user.

On the other hand, more of the heat produced by the heating device 30 is transferred along another branch path around the shortest branch path in the heat transfer path three L3, to accelerate a speed at which heat is transferred to another region around a region on the first surface A and right opposite to the heating device 30. In this way, uniformity of heat that is transferred to various regions on the first surface A is improved, thereby further improving the heat dissipation efficiency, avoiding heat concentration, and improving the heat experience of the user.

In FIG. 35, only an example in which the heat insulation structure 70 is arranged in the circuit board bracket 52 is used for description. In this way, the heat insulation structure 70 does not interfere with a circuit in the electronic device 100. In addition, since structural strength of the circuit board bracket 52 is relatively high, it can be avoided that the circuit board bracket 52 is deformed or broken during arrangement of the heat insulation structure 70. Furthermore, the heat insulation structure 70 may alternatively be arranged in another component in the heat transfer path three L3.

Figure 36:
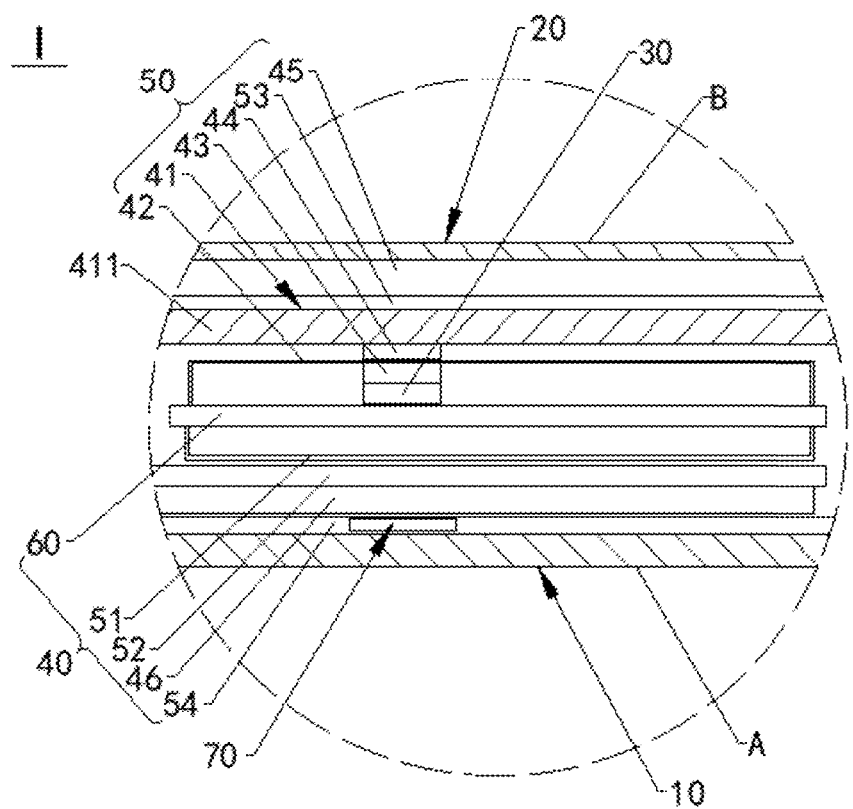
FIG. 36 is a schematic cross-sectional structural diagram of an electronic device according to still other embodiments of this application.

For example, FIG. 36 is a schematic cross-sectional structural diagram of an electronic device 100 according to still other embodiments of this application. In this embodiment, the heat insulation structure 70 is arranged in the second buffer layer 54. The second buffer layer 54 is usually made of a soft and elastic material such as foam and therefore is relatively low in hardness, which is convenient for the arrangement of the heat insulation structure 70.

In still some other embodiments, the heat insulation structure 70 may alternatively be arranged in a first adhesive layer 461b of the first heat conducting member 46.

According to the foregoing descriptions, the heat insulation structure 70 may be arranged in the circuit board bracket 52, the second buffer layer 54, and the first adhesive layer 461b of the first heat conducting member 46. In addition, there may be a plurality of heat insulation structures 70, and the plurality of heat insulation structures 70 are respectively arranged in more of the circuit board bracket 52, the second buffer layer 54, and the first adhesive layer 461b of the first heat conducting member 46. Furthermore, in a case that there are a plurality of first adhesive layers 461b in the first heat conducting member 46, the plurality of heat insulation structures 70 may alternatively be arranged in the plurality of first adhesive layers 461b in the first heat conducting member 46.

It should be noted that in a case that the heat insulation structure 70 is arranged in the circuit board bracket 52, the second buffer layer 54, or the first adhesive layer 461b of the first heat conducting member 46, an arrangement quantity, a size, a structural form and an arrangement position of the heat insulation structure may be determined with reference to an arrangement quantity, a size, a structural form, and an arrangement position in a case that the heat insulation structure 70 is arranged in the middle frame 41 in the foregoing embodiment, and details are not described herein again.

The foregoing describes the purpose of improving the uniformity of the heat of the first surface A and the second surface B by arranging the heat insulation structure 70 in the heat transfer path three L3. Based on this, at least one component in the heat transfer path four L4 may be replaced with a component with a higher heat conduction coefficient. For example, the material of the second heat conducting material layer in the second heat conducting member 53 in the heat transfer path four L4 is replaced with at least one of graphite or graphene with a higher heat conduction coefficient, to accelerate a heat transfer speed of the heat transfer path four L4, thereby further reducing a difference between a heat transfer speed of the heat transfer path three L3 and the heat transfer speed of the heat transfer path four L4, and enabling the heat to be transferred to the first surface A and the second surface B more uniformly.

In the descriptions of this specification, the specific features, structures, materials, or characteristics may be combined in a proper manner in any one or more of the embodiments or examples.

Finally, it should be noted that the foregoing embodiments are merely intended for describing the technical solutions of this application, but not for limiting this application. Although this application is described in detail with reference to the foregoing embodiments, a person of ordinary skill in the art is to understand that they may still make modifications to the technical solutions described in the foregoing embodiments or make equivalent replacements to some technical features thereof, without departing from the spirit and scope of the technical solutions of the embodiments of this application.

What is claimed is:

1. An electronic device, comprising:
    a first surface component with a first surface, wherein the first surface forms an outer surface of the electronic device;
    a heating device located on a first side of the first surface component facing away from the first surface; and
    a first heat transfer assembly located between the heating device and the first surface component,
    wherein heat is conducted from the heating device to the first surface component through the first heat transfer assembly, a heat insulation structure is arranged in the first heat transfer assembly, and a first orthographic projection of the heat insulation structure on the first surface overlaps with a second orthographic projection of the heating device on the first surface, and
    wherein the first heat transfer assembly comprises a first heat conducting member with a first stack structure, the first stack structure is formed by first heat conducting material layers and first adhesive layers that are alternately arranged in sequence, and the heat insulation structure is arranged in the first adhesive layer.

2. The electronic device of claim 1, wherein a material of the first heat conducting material layers comprise one of graphite, graphene, copper, or copper alloy.

3. The electronic device of claim 1, wherein there are a plurality of first adhesive layers and a plurality of heat insulation structures, and the plurality of heat insulation structures are respectively arranged in the plurality of first adhesive layers.

4. The electronic device of claim 1, wherein an end portion of the first stack structure in a direction in which the first heat conducting material layers and the first adhesive layers are stacked is formed by a first adhesive layer.

5. The electronic device of claim 4,
    wherein the first adhesive layer forming the end portion of the first stack structure comprises a third surface, the third surface forms another outer surface of the first stack structure, the first stack structure further comprises a fourth surface, and the fourth surface and the third surface face away from each other, and
    wherein the first heat conducting member further comprises a first protective layer, and the first protective layer is arranged on the fourth surface of the first stack structure.

6. The electronic device of claim 1, wherein the first surface component is a front cover plate.

7. The electronic device of claim 6,
    wherein the first heat transfer assembly further comprises a middle frame, and
    wherein the middle frame is located between the first heat conducting member and the heating device, the middle frame and the first surface component are stacked, and the heat insulation structure is arranged in the middle frame.

8. The electronic device of claim 6, further comprising a display module,
    wherein the display module is located between the first heat conducting member and the first surface component, and the display module comprises a display panel and a support structure, and
    wherein the first heat transfer assembly further comprises the support structure, and the heat insulation structure is arranged in the support structure.

9. The electronic device of claim 8, wherein the support structure comprises a support layer, a first buffer layer, a flat layer, and a protective layer, and wherein the heat insulation structure is arranged in one of the support layer, the first buffer layer, the flat layer, or the protective layer.

10. The electronic device of claim 1, wherein the first surface component is a back cover.

11. The electronic device of claim 10, further comprising a circuit board and a circuit board bracket,
    wherein both the circuit board and the circuit board bracket are located between the heating device and the first heat conducting member, the heating device is arranged on the circuit board, and the circuit board bracket is arranged on a side of the circuit board away from the heating device, and
    wherein the first heat transfer assembly further comprises the circuit board bracket, and the heat insulation structure is arranged in the circuit board bracket.

12. The electronic device of claim 10,
    wherein the first heat transfer assembly further comprises a second buffer layer, and
    wherein the second buffer layer is arranged between the first heat conducting member and the first surface component, and the heat insulation structure is arranged in the second buffer layer.

13. The electronic device of claim 1, wherein the heat insulation structure comprises one of a heat insulation air hole, heat insulation aerogel, asbestos, rock wool, ceramic fiber paper, fiberglass wool, silicate, or a vacuum plate.

14. The electronic device of claim 1, wherein in the first heat transfer assembly, a component where the heat insulation structure is located comprises a first portion, the second orthographic projection is located in a third orthographic projection of the first portion on the first surface, a distance between a second edge of the second orthographic projection and a first edge of the first orthographic projection is less than or equal to ½ of a maximum width of the second orthographic projection, and the heat insulation structure is arranged in the first portion.

15. The electronic device of claim 14, wherein the component where the heat insulation structure is located further comprises a second portion, the second portion is a portion other than the first portion on the component where the heat insulation structure is located, and no heat insulation structure is arranged in the second portion.

16. The electronic device of claim 1, further comprising a second surface component,
    wherein the second surface component comprises a second surface, and the second surface forms another outer surface of the electronic device, and wherein the heating device is further located on a second side of the second surface component facing away from the second surface, and heat is conducted from the heating device to the second surface component.

17. The electronic device of claim 16, further comprising a second heat transfer assembly,
wherein the second heat transfer assembly is located between the heating device and the second surface component, and heat is conducted from the heating device to the second surface component through the second heat transfer assembly.

18. The electronic device of claim 17,
wherein the second heat transfer assembly comprises a second heat conducting member, and
wherein the second heat conducting member comprises a second stack structure, and the second stack structure is formed by second heat conducting material layers and second adhesive layers that are alternately arranged in sequence.

19. The electronic device of claim 18, wherein a material of the second heat conducting material layers comprise at least one of graphite or graphene.

20. The electronic device of claim 19,
wherein the first surface comprises a first region, and the first region overlaps with the second orthographic projection,
wherein the second surface comprises a second region, and the second region overlaps with a third orthographic projection of the heating device on the second surface, and
wherein a first speed at which heat is transferred from the heating device to the first region is equal to a second speed at which the heat is transferred from the heating device to the second region.

* * * * *